(12) United States Patent
Liu et al.

(10) Patent No.: US 9,172,040 B2
(45) Date of Patent: *Oct. 27, 2015

(54) RESISTIVE MEMORY CELL FABRICATION METHODS AND DEVICES

(71) Applicant: MICRON TECHNOLOGY, INC., Boise, ID (US)

(72) Inventors: Jun Liu, Boise, ID (US); Michael P. Violette, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/463,160

(22) Filed: Aug. 19, 2014

(65) Prior Publication Data

US 2014/0363947 A1    Dec. 11, 2014

Related U.S. Application Data

(60) Division of application No. 13/467,920, filed on May 9, 2012, now Pat. No. 8,835,893, which is a continuation of application No. 12/783,375, filed on May 19, 2010, now Pat. No. 8,193,521, which is a division of application No. 11/785,391, filed on Apr. 17, 2007, now Pat. No. 7,745,231.

(51) Int. Cl.
*H01L 45/00* (2006.01)
*G11C 13/00* (2006.01)
(Continued)

(52) U.S. Cl.
CPC ........ *H01L 45/1608* (2013.01); *G11C 13/0004* (2013.01); *H01L 45/06* (2013.01); *H01L 45/122* (2013.01); *H01L 45/144* (2013.01);
(Continued)

(58) Field of Classification Search
CPC ..... H01L 45/002; H01L 45/06; H01L 45/122; H01L 45/1608; H01L 45/1645; H01L 23/02
USPC ......... 438/3; 257/E21.008, 104, 664, 27.004, 257/16, 31.029, 45.002
See application file for complete search history.

(56) References Cited

U.S. PATENT DOCUMENTS

| 5,825,046 A | 10/1998 | Czubatyj et al. |
| 6,511,867 B2 | 1/2003 | Lowrey et al. |

(Continued)

FOREIGN PATENT DOCUMENTS

| EP | 1351253 A1 | 10/2003 |
| EP | 1439583 A1 | 7/2004 |

(Continued)

OTHER PUBLICATIONS

Hudgens, et al., "Overview of Phase-Change Chalcogenide Nonvolatile Memory Technology", *MRIS Bulletin*, Nov. 2004, pp. 829-832.

(Continued)

*Primary Examiner* — Michael Lebentritt
(74) *Attorney, Agent, or Firm* — Dickstein Shapiro LLP

(57) ABSTRACT

A phase change memory cell and methods of fabricating the same are presented. The memory cell includes a variable resistance region and a top and bottom electrode. The shapes of the variable resistance region and the top electrode are configured to evenly distribute a current with a generally hemispherical current density distribution around the first electrode.

12 Claims, 22 Drawing Sheets

(51) Int. Cl.
  *H01L 21/02* (2006.01)
  *H01L 23/02* (2006.01)
  *H01L 27/24* (2006.01)

(52) U.S. Cl.
  CPC ........ *H01L45/1675* (2013.01); *H01L 45/1683* (2013.01); *H01L 21/02* (2013.01); *H01L 23/02* (2013.01); *H01L 27/2436* (2013.01); *H01L 2924/0002* (2013.01)

(56) References Cited

U.S. PATENT DOCUMENTS

| | | | |
|---|---|---|---|
| 6,555,860 B2 | 4/2003 | Lowrey et al. | |
| 6,746,892 B2 | 6/2004 | Lee et al. | |
| 6,791,102 B2 | 9/2004 | Johnson et al. | |
| 6,795,338 B2 | 9/2004 | Parkinson et al. | |
| 6,830,952 B2 | 12/2004 | Lung | |
| 6,888,155 B2 | 5/2005 | Campbell | |
| 6,914,255 B2 | 7/2005 | Lowrey | |
| 6,927,093 B2 | 8/2005 | Lowrey et al. | |
| 6,969,866 B1 | 11/2005 | Lowrey et al. | |
| 7,038,261 B2 | 5/2006 | Horii | |
| 7,078,273 B2 | 7/2006 | Matsuoka et al. | |
| 7,129,560 B2 | 10/2006 | Hamann et al. | |
| 7,135,696 B2 | 11/2006 | Karpov et al. | |
| 7,161,167 B2 | 1/2007 | Johnson | |
| 7,205,562 B2 | 4/2007 | Wicker | |
| 7,254,059 B2 | 8/2007 | Li et al. | |
| 7,259,023 B2 | 8/2007 | Kuo et al. | |
| 7,262,427 B2 | 8/2007 | Lee et al. | |
| 7,297,997 B2 | 11/2007 | Shin et al. | |
| 7,307,269 B2 | 12/2007 | Kim et al. | |
| 7,323,707 B2 | 1/2008 | Dennison | |
| 7,332,735 B2 | 2/2008 | Campbell | |
| 7,338,857 B2 | 3/2008 | Besana et al. | |
| 7,348,268 B2 | 3/2008 | Dennison | |
| 7,407,829 B2 | 8/2008 | Lowrey et al. | |
| 7,423,300 B2 | 9/2008 | Lung et al. | |
| 7,439,536 B2 | 10/2008 | Pellizzer et al. | |
| 7,442,603 B2 | 10/2008 | Lai et al. | |
| 7,456,421 B2 | 11/2008 | Lung | |
| 7,459,717 B2 | 12/2008 | Lung | |
| 7,688,619 B2 | 3/2010 | Lung et al. | |
| 7,745,231 B2 * | 6/2010 | Liu et al. | 438/3 |
| 8,193,521 B2 | 6/2012 | Liu et al. | |
| 2004/0113136 A1 | 6/2004 | Dennison | |
| 2005/0029627 A1 | 2/2005 | Dennison | |
| 2008/0247226 A1 | 10/2008 | Liu et al. | |
| 2009/0179184 A1 | 7/2009 | Liu | |
| 2010/0151637 A1 | 6/2010 | Liu et al. | |

FOREIGN PATENT DOCUMENTS

| | | |
|---|---|---|
| EP | 1710807 A1 | 10/2006 |
| WO | WO-00-57498 A1 | 9/2000 |

OTHER PUBLICATIONS

Lankhorst, et al., "Low-cost and nanoscale non-volatile memory concept for future silicon chips", *Nature Materials*, vol. 4, Apr. 2005, pp. 347-352.

\* cited by examiner

RESISTIVE MEMORY CELL FABRICATION METHODS AND DEVICES

This application is a divisional application of U.S. patent application Ser. No. 13/467,920, which is a continuation of U.S. patent application Ser. No. 12/783,375, filed May 19, 2010, now U.S. Pat. No. 8,193,521, issued Jun. 5, 2012, which is a divisional of U.S. patent application Ser. No. 11/785,391, filed Apr. 17, 2007, now U.S. Pat. No. 7,745,231, issued Jun. 29, 2010, the specifications of each of which are herein incorporated by reference in their entirety.

FIELD OF THE INVENTION

The embodiments of the invention relate generally to the field of semiconductor devices and, more particularly, to resistive memory devices, for example, phase change memory devices.

BACKGROUND OF THE INVENTION

Microprocessor-accessible memory devices have traditionally been classified as either non-volatile or volatile memory devices. Non-volatile memory devices are capable of retaining stored information even when power to the memory device is turned off. Traditionally, however, non-volatile memory devices occupy a large amount of space and consume large quantities of power, making these devices unsuitable for use in portable devices or as substitutes for frequently-accessed volatile memory devices. On the other hand, volatile memory devices tend to provide greater storage capability and programming options than non-volatile memory devices. Volatile memory devices also generally consume less power than non-volatile devices. However, volatile memory devices require a continuous power supply in order to retain stored memory content.

Research and development of commercially viable memory devices that are randomly accessed, have relatively low power consumption, and are non-volatile is ongoing. One ongoing area of research is into resistive memory cells where resistance states can be programmably changed. One avenue of research relates to devices that store data in memory cells by structurally or chemically changing a physical property of the memory cells in response to applied programming voltages, which in turn change cell resistance. Examples of variable resistance memory devices being investigated include memories using variable resistance polymers, perovskite, doped amorphous silicon, phase-changing glasses, and doped chalcogenide glass, among others.

FIG. 1A shows a basic composition of a variable resistance memory cell 10 constructed over a substrate 11, having a variable resistance material 16 formed between a bottom electrode 14 and a top electrode 18. The bottom electrode is located within an insulating layer 12. One type of variable resistance material may be amorphous silicon doped with V, Co, Ni, Pd, Fe and Mn as disclosed in U.S. Pat. No. 5,541,869 to Rose et al. Another type of variable resistance material may include perovskite materials such as $Pr_{(1-x)}Ca_xMnO_3$ (PCMO), $La_{(1-x)}Ca_xMnO_3$ (LCMO), $LaSrMnO_3$ (LSMO), $GdBaCo_xO_y$ (GBCO) as disclosed in U.S. Pat. No. 6,473,332 to Ignatiev et al. Still another type of variable resistance material may be a doped chalcogenide glass of the formula $A_xB_y$, where "B" is selected from among S, Se and Te and mixtures thereof, and where "A" includes at least one element from Group III-B (B, Al, Ga, In, Tl), Group IV-B (C, Si, Ge, Sn, Pb), Group V-B (N, P, As, Sb, Bi), or Group VII-B (F, Cl, Br, I, At) of the periodic table, and with the dopant being selected from among the noble metals and transition metals, including Ag, Au, Pt, Cu, Cd, Ir, Ru, Co, Cr, Mn or Ni, as disclosed in U.S. Pat. Nos. 6,881,623 and 6,888,155 to Campbell et al. and Campbell, respectively. Yet another type of variable resistance material includes a carbon-polymer film comprising carbon black particulates or graphite, for example, mixed into a plastic polymer, such as that disclosed in U.S. Pat. No. 6,072,716 to Jacobson et al. The material used to form the electrodes 14, 18 can be selected from a variety of conductive materials, such as tungsten, nickel, tantalum, titanium, titanium nitride, aluminum, platinum, or silver, among others.

Much research has focused on memory devices using memory elements composed of chalcogenides. Chalcogenides are alloys of Group VI elements of the periodic table, such as Te or Se. A specific chalcogenide currently used in rewriteable compact discs ("CD-RWs") is $Ge_2Sb_2Te_5$. In addition to having valuable optical properties that are utilized in CD-RW discs, $Ge_2Sb_2Te_5$ also has desirable physical properties as a variable resistance material. Various combinations of Ge, Sb and Te may be used as variable resistance materials and which are herein collectively referred to as GST materials. Specifically, GSTs can change structural phases between an amorphous phase and two crystalline phases. The resistance of the amorphous phase ("a-GST") and the resistances of the cubic and hexagonal crystalline phases ("c-GST" and "h-GST," respectively) can differ significantly. The resistance of amorphous GST is greater than the resistances of either cubic GST or hexagonal GST, whose resistances are similar to each other. Thus, in comparing the resistances of the various phases of GST, GST may be considered a two-state material (amorphous GST and crystalline GST), with each state having a different resistance that can be equated with a corresponding binary state. A variable resistance material such as GST whose resistance changes according to its material phase is referred to as a phase change material.

The transition from one GST phase to another occurs in response to temperature changes of the GST material. As shown in FIG. 2, the GST material has a melting temperature $T_m$ and a crystallization temperature $T_x$. The crystallization temperature $T_x$ is lower than the melting temperature $T_m$. Both the crystallization temperature $T_x$ and the melting temperature $T_m$ are higher than room temperature. When the GST material is heated above the melting temperature $T_m$, the GST material loses its crystalline structure. If the GST material is then rapidly cooled to room temperature, the GST material is formed into an amorphous state—the cooling occurs too fast to allow a crystalline structure to grow. On the other hand, if the GST material is warmed to a temperature above the crystallization temperature $T_x$ but below the melting temperature $T_m$, a crystalline structure is able to grow. Once converted into a crystalline structure, the GST material remains in a crystalline structure until it is again heated above the melting temperature $T_m$. In other words, at room temperature, the GST material is stable in either the amorphous or crystalline phases.

In a phase change memory cell, the heating and cooling can occur by causing differing strengths of current to flow through the GST material. The GST material is placed in a crystalline state by passing a crystallizing current through the GST material, thus warming the GST material to a temperature wherein a crystalline structure may grow. A stronger melting current is used to melt the GST material for subsequent cooling to an amorphous state. As the typical phase change memory cell uses the crystalline state to represent one logic value, e.g., a binary "1," and the amorphous state to represent another logic value, e.g., a binary "0," the crystallizing current is referred to as a set current $I_{SET}$ and the melting current is referred to as an erase or reset current $I_{RST}$. One skilled in the art will understand, however, that the assignment of GST states to binary values may be switched if desired.

The state of the GST material is determined by applying a small read voltage $V_r$ across the two electrodes and by measuring the resultant read current $I_r$. A lower read current $I_r$ corresponds to a higher resistance. Thus, a relatively low read current $I_r$ signifies that the GST material is in an amorphous state and a relatively high read current $I_r$ signifies that the GST material is in a crystalline state.

The phase-changing current is applied to the GST material via electrodes that bound the GST material. In FIG. 1B, for example, the phase-changing currents are applied via the bottom electrode 14 and the top electrode 18. Because of the configurations of the bounding surface areas of the two electrodes, current densities 50 within the GST material are not equally distributed. In particular, current densities 50 near the bottom electrode 14 are greater than the densities near the top electrode 18. Furthermore, areas of the GST material that are directly in between the two electrodes 14, 18 have higher current densities 50 than areas that are not directly in between the two electrodes 14, 18, such as areas near the lower corners of the GST material.

The uneven current distribution has two significant effects. First, the area of highest current density is the area most responsive to reset currents $I_{RST}$ and set currents $I_{SET}$. This most responsive area is near the smaller lower electrode. Second, because certain areas of the GST material have a very low current density, these areas may not be as responsive to phase-changing currents. These areas may include not only the lower corners of the GST material but also significant portions of the lower edge of the GST material. It is even possible that regions near the lower electrode and lower edge may have insufficiently high current densities to fully transform the phase of the entire region of GST material near the lower electrode. In other words, the application of a read voltage $V_r$ could result in stray or leak currents through incompletely transformed regions of the GST material, thus resulting in erroneous GST phase state determination.

A current distribution graph 90 is illustrated in FIG. 1C. The graph 90 illustrates a cross-sectional view of the right half (which mirrors the left half) of the phase change material 16 of memory cell 10. The top edge of the phase change material 16 is identified near the top of the graph 90. The bottom edge of the phase change material 16 coincides with the bottom edge of the graph 90. The right edge of the phase change material 16 would be located just beyond the right side of graph 90. The left side of graph 90 represents the center or the horizontal midpoint of the phase change material 16. When a current is passed from the bottom electrode 14 to the top electrode 18 of memory cell 10, the current passes through the phase change material 16. The distribution of the current within the phase change material 16 is depicted in FIG. 1C. Isometric contour lines 92 represent the current density of an applied reset current $I_{RST}$. The graph 90 shows that current is more broadly distributed in the vertical direction (towards the top electrode 18) than in the horizontal direction. It is desirable, however, to redistribute the current density horizontally to achieve better conversion of the phase change material to the amorphous GST state upon application of a phase changing current, thus reducing leak currents. As a result, the required programming currents to achieve the same RESET resistance may also be reduced. Such a redistribution may also assist in the operation of other resistance memory materials as well.

Accordingly, methods and structures that reduce resistive memory, e.g., phase change memory, leak currents and programming currents are desired.

DETAILED DESCRIPTION OF THE INVENTION

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate or wafer in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

Figure 3:
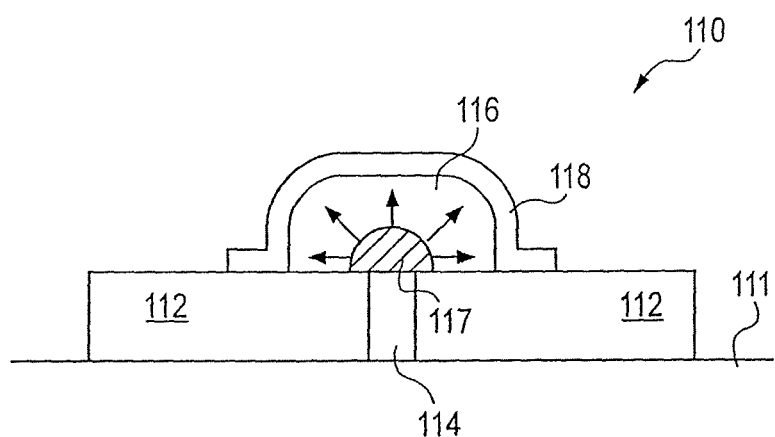
FIG. 3 illustrates an ideal phase change memory cell according to a disclosed embodiment.

In order to prevent leak currents in a variable resistance memory cell 110, using a phase change material as shown in FIG. 3, a reset current $I_{RST}$ must be applied with sufficient current density to fully convert the entire GST region near a lower electrode 114 into an amorphous state. In FIG. 3, an ideal converted amorphous GST region 117 is illustrated in a phase change memory cell 110 that includes an insulating layer 112, a lower electrode 114, GST phase change material 116 and a top electrode 118. The entire memory cell 110 is formed above a substrate 111. In the ideal case, a uniform hemispherical amorphous GST region 117 is formed as a result of a reset current $I_{RST}$. The hemispherical amorphous GST region 117 fully covers the lower electrode 114 as well as much of the surrounding GST material 116. Because the top electrode 118 is also hemispherical, the reset current $I_{RST}$ is more evenly distributed throughout the GST phase change material 116. The more evenly distributed reset current $I_{RST}$ results in an more evenly and completely transformed hemispherical amorphous GST region 117 that in turn prevents leak currents during application of a read voltage $V_r$.

Figure 4A:
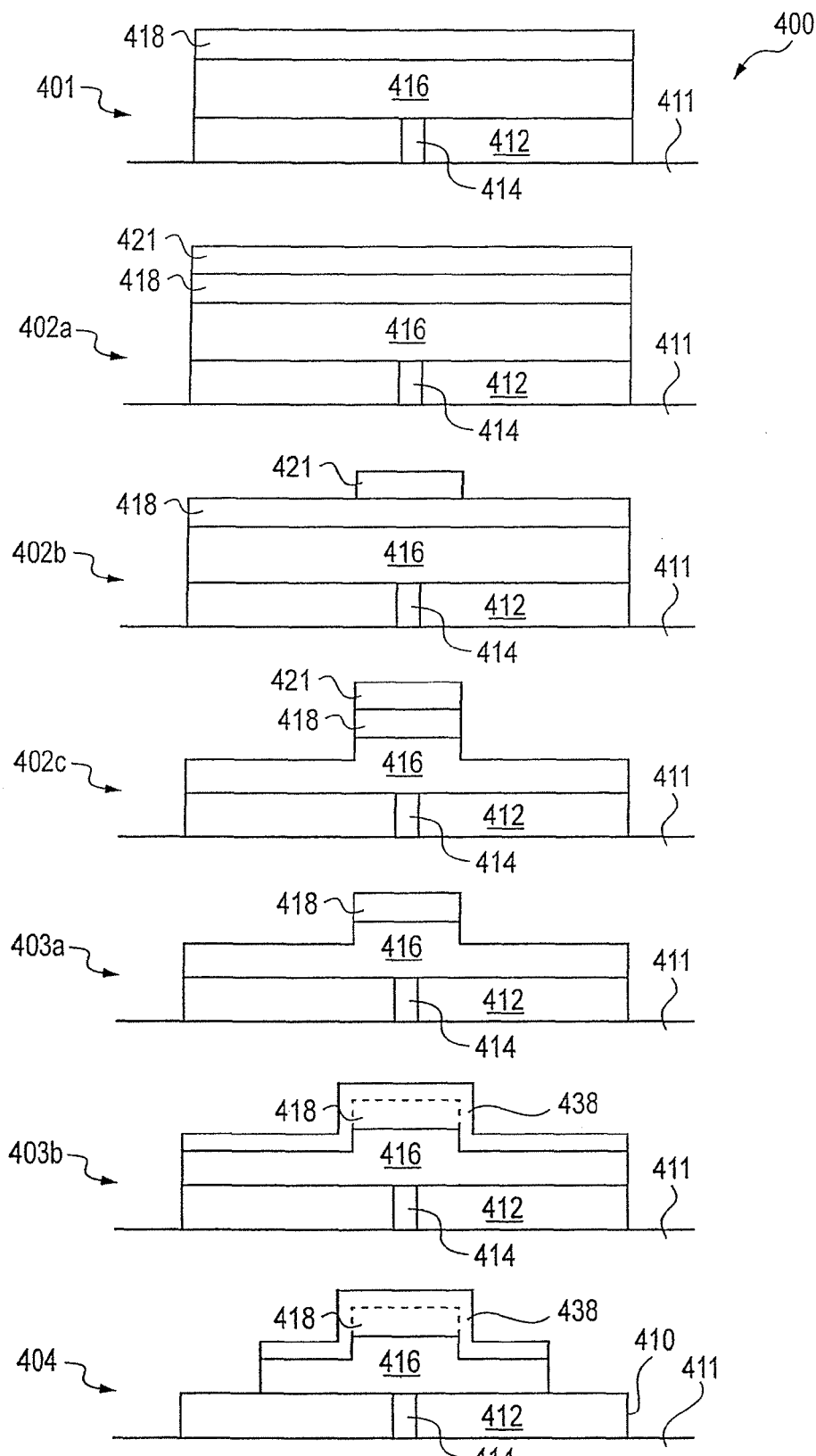
FIGS. 4A and 4B illustrate a method of fabricating a phase change memory cell and a corresponding current distribution graph according to a disclosed embodiment.

One method 400 of fabricating a memory cell that approximates the ideal memory cell 110 is illustrated in FIG. 4A. At step 401, an insulating layer 412 is formed on top of a substrate 411. The insulating layer may be, for example, silicon or silicon-based such as silicon nitride. A bottom electrode 414 is then formed within the insulating layer 412 by any method known in the art. For example, a via may be formed within the insulating layer 412 and then filled with the bottom electrode 414 material. Chemical mechanical planarization or other known methods are used to remove excess bottom electrode 414 material from the surface of insulating layer 412. The bottom electrode material may be any generally conductive material that is used as an electrode, such as, for example, tungsten, platinum, titanium nitride, tantunum nitride, or titanium aluminum nitride. Phase change material 416 is thereafter deposited onto the planarized bottom electrode 414 and the insulating layer 412. The phase change material may be any of the various variable resistance materials listed above or may be a specific composition of GST. A top electrode layer 418 is deposited on top of the phase change material 416 by any method known in the art. The top electrode is generally, but not required, formed of the same material as the bottom electrode material 414. At step 402, photolithography and dry etch techniques are used to pattern the top electrode 418 and etch into the phase change material 416, for example, halfway through the phase change material 416. Step 402 is completed by applying a photoresist layer 421 to the top electrode 418 (step 402a). A photomask may be used to selectively remove or develop portions of the photoresist layer 421 so that the only remaining portion of the photoresist layer 421 is a portion that is located generally above the bottom electrode 414 (step 402b). A dry etch process is then used to etch away the exposed top electrode layer 418 and part of the phase change material 416 (step 402c).

At step 403a, the photoresist layer 421 is stripped away by any known method. Then, at step 403b, an additional top electrode layer 438 is deposited on top of the exposed phase change material 416 and the remaining first top electrode layer 418. A dashed line is used in FIG. 4A at step 403b in between layers 418 and 438 to indicate that they are both of the same top electrode material. At step 404, photo patterning is used to mask the centrally-located portions of the top electrode 438. The non-masked peripheral portions are then etched away using a dry etch technique. The dry etch is continued until the peripheral portions of the top electrode 438 and the phase change material 416 are removed. The remaining structure is a phase change memory cell 410 whose shape results in an approximation of the current densities observed in the ideal phase change memory cell 110 of FIG. 3.

Figure 1A:
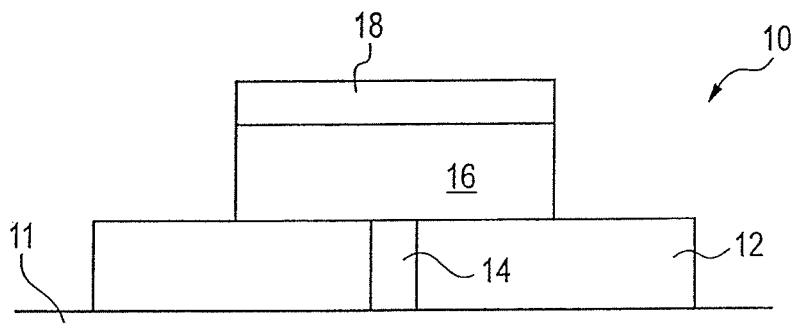
FIGS. 1A, 1B and 1C illustrate a phase change memory cell and a corresponding current distribution graph.
Figure 1B:
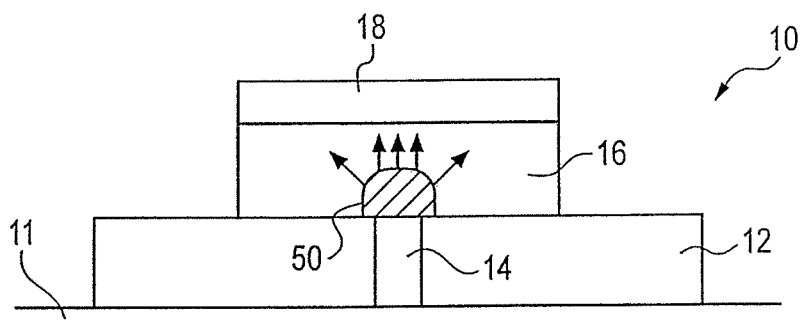
Figure 1C:
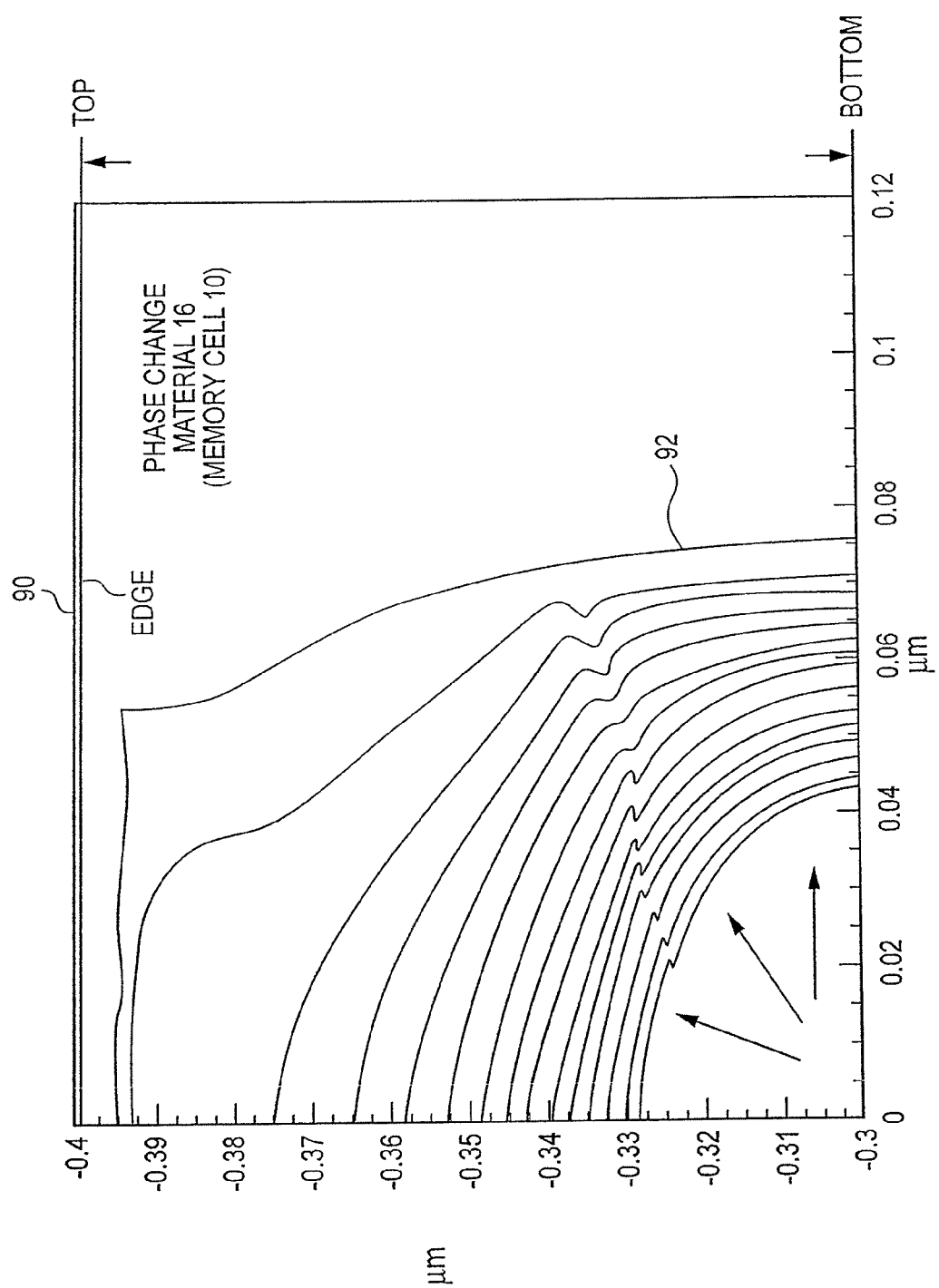
Figure 2:
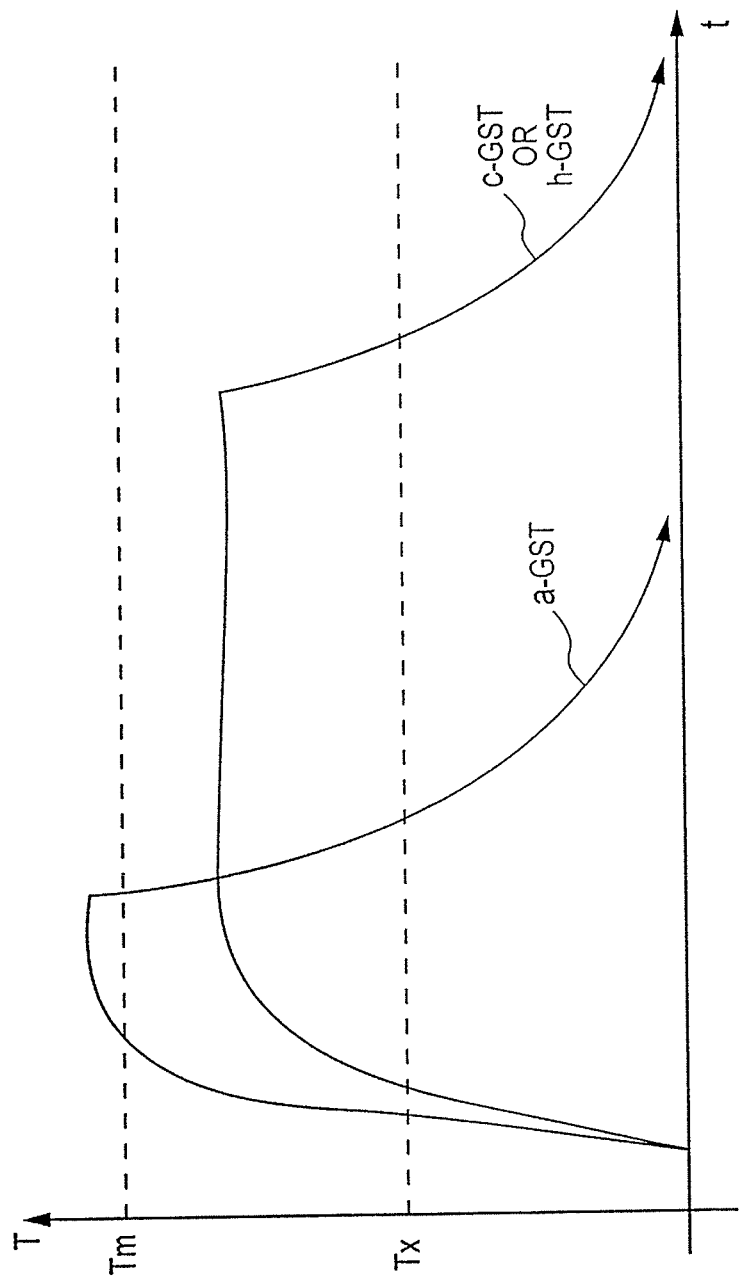
FIG. 2 illustrates the phase transitions for a GST material.
Figure 4B:
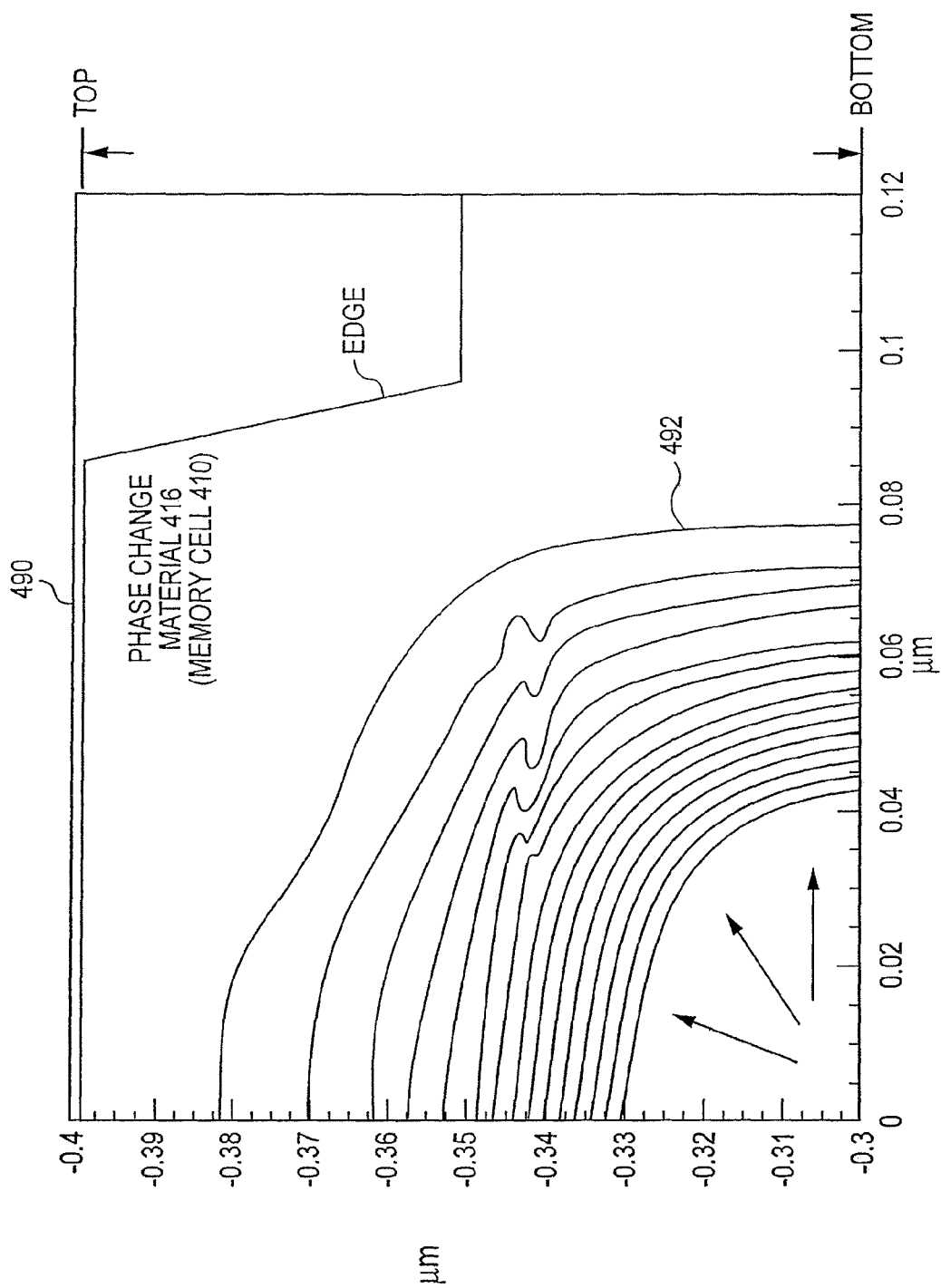

A current distribution graph 490 is illustrated in FIG. 4B. Graph 490 illustrates a cross-sectional view of the right half (which mirrors the left half) of the phase change material 416 of memory cell 410. As in graph 90 of FIG. 1C, the top edge of the phase change material 416 of memory cell 410 is indicated in graph 490. In graph 490, however, the stepwise shape of the top edge of the phase change material 416 is indicated. One will note that the step edge is not completely vertical, thus representing the limitations of creating a vertical edge using an etch process. The non-vertical edge also helps, however, in reshaping the current distribution. The far right edge of the phase change material 416 is just beyond the right edge of the graph 490. The bottom of the graph 490 coincides with the bottom edge of the phase change material 416, and the left side of the graph 490 is located at the horizontal midpoint of the phase change material 416. Isometric contour lines 492 represent the current density of an applied reset current $I_{RST}$. The current distribution illustrated in graph 490 is improved over the current distribution of the traditional phase change memory cell 10 as illustrated in graph 90 of FIG. 1C. The stepwise shape of memory cell 410 results in a suppression of the vertical current distribution and promotion of lateral current distribution. The result is a more dense generally hemispherical current distribution than that produced in the traditional phase change memory cell 10. Furthermore, the suppression of vertical current distribution has the additional benefit of reducing heat loss through the top electrode and the corresponding heat-induced top electrode delamination.

Figure 5:
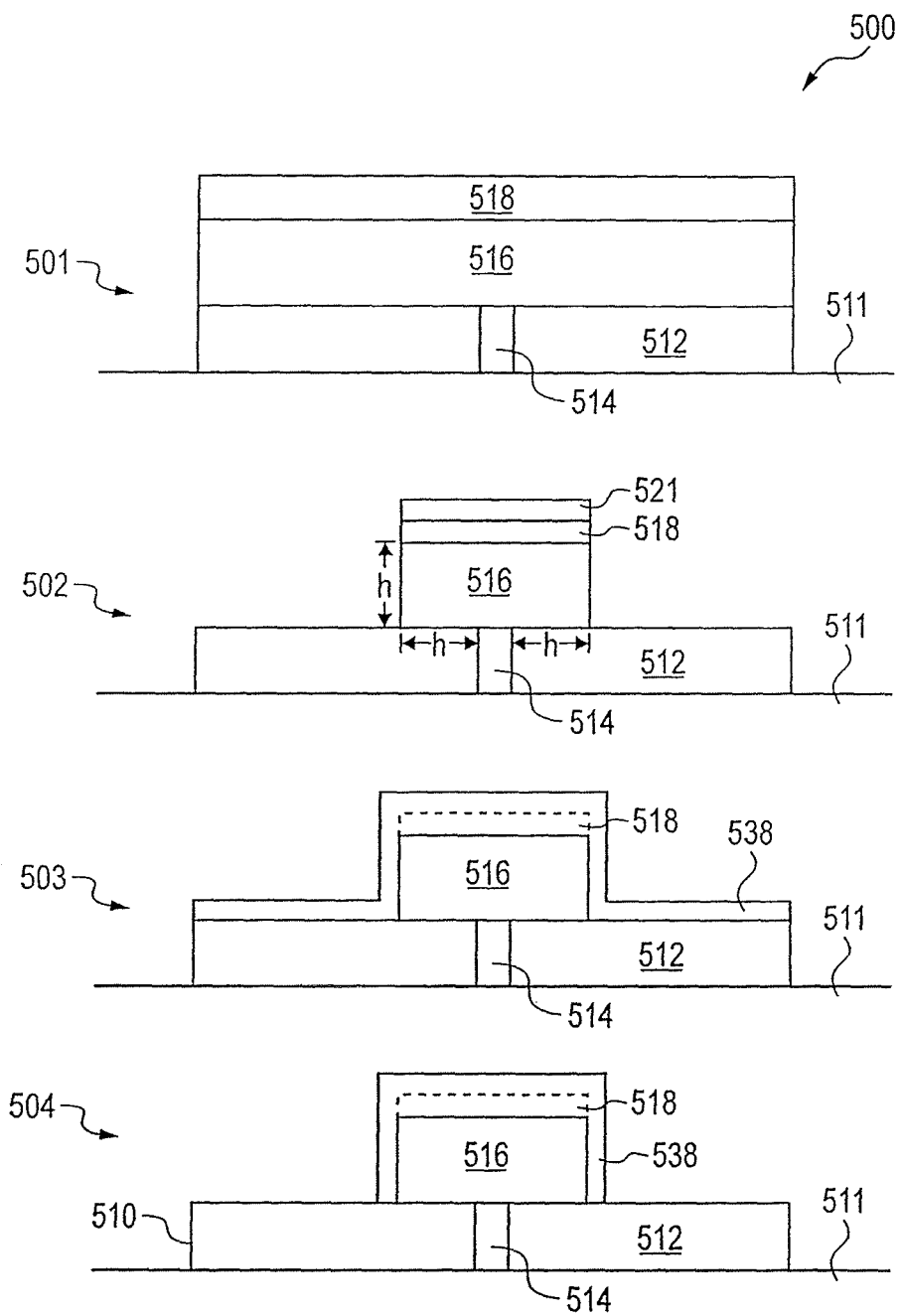
FIG. 5 illustrates a method of fabricating a phase change memory cell according to a disclosed embodiment.

Another method 500 of fabricating a memory cell that approximates the ideal memory cell 110 is illustrated in FIG. 5. At step 501, an insulating layer 512 is formed above a substrate 511. A bottom electrode 514 is then formed within the insulating layer 512 using any known method. For example, a via could be etched within the insulating layer 512 and then filled with the bottom electrode material 514. Chemical mechanical planarization can be used to remove excess bottom electrode material 514 before fowling additional layers. Phase change material 516 is thereafter deposited onto the planarized bottom electrode 514 and insulating layer 512. The phase change material 516 may be polished using chemical mechanical planarization or other known methods. A top electrode layer 518 is deposited on top of the phase change material 516. At step 502, photolithography and dry etch techniques are used to pattern the top electrode 518 and etch through peripheral portions of the phase change material 516. Also at step 502, a photoresist layer 521 is applied to the top electrode 518. A photomask may be used to selectively remove or develop portions of the photoresist layer 521 so that the only remaining portion of the photoresist layer 521 is a portion that is located generally above the bottom electrode 514. The width of the remaining photoresist layer 521 is approximately equal to the width of the bottom electrode plus twice the height of the phase change material 516. A typical height of the phase change material 516 is around 100 nanometers. A typical width of the bottom electrode 514 is around 50 nanometers. A smaller width is also possible. Thus, a typical width of the remaining photoresist layer 521 is around 250 nanometers. A dry etch process is then applied to the exposed top electrode layer 518. The dry etch is continued until the exposed top electrode layer 518 is etched away and also all of the phase change material 516 underlying the exposed top electrode layer 518, thus forming the structure illustrated in step 502.

At step 503, the photoresist layer 521 is stripped away. Then, an additional top electrode layer 538 is deposited on top of the exposed phase change material 516 and the remaining first top electrode layer 518. A dashed line is used in FIG. 5 at step 503 in between layers 518 and 538 to indicate that they are both of the same top electrode material. The additional top electrode layer 538 is also deposited onto the sidewalls of the phase change material 516. At step 504, a spacer dry etch is used to remove the peripheral portions of the top electrode 538. Alternatively, photo patterning is used to mask the centrally-located portions of the top electrode 538. The non-masked peripheral portions are then etched away using a dry etch technique. The dry etch is continued until the peripheral portions of the top electrode 538 are removed. The remaining structure, illustrated at step 504, is a phase change memory cell 510 with an encapsulating top electrode 538 that approximates the ideal phase change memory cell 110 of FIG. 3. A graph illustrating the current distribution of the phase change memory cell 510 is shown in FIG. 6B and is explained below.

Figure 6A:
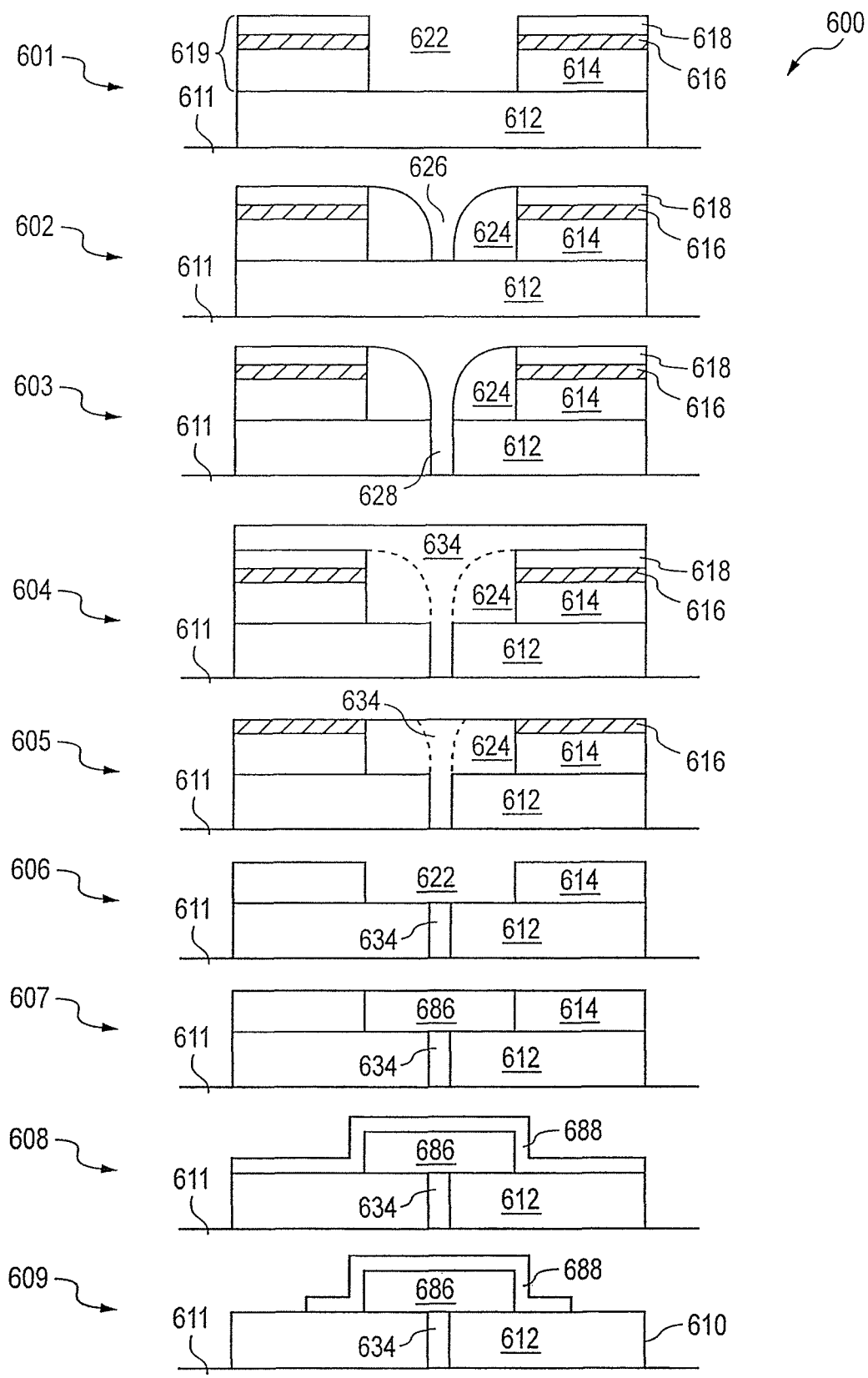
FIGS. 6A and 6B illustrate a method of fabricating a phase change memory cell and a corresponding current distribution graph according to a disclosed embodiment.
Figure 6B:
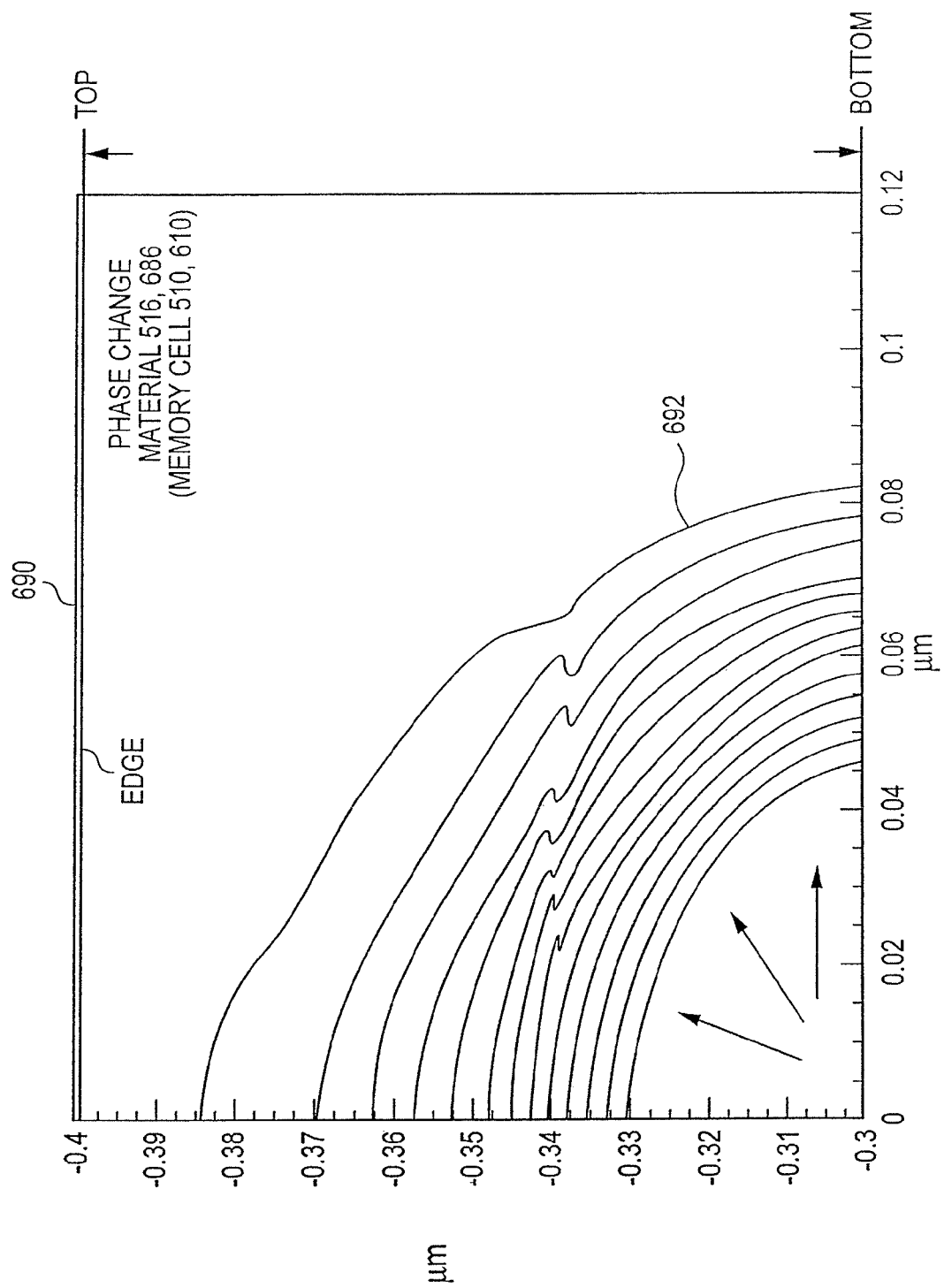

FIG. 6A illustrates another method of making a phase change memory cell with an encapsulating top electrode like the memory cell 510 of FIG. 5. In method 600, a self-aligned planar cell 610 is fabricated. The self-aligned planar cell 610 is functionally identical to the memory cell 510 of FIG. 5, except that memory cell 610 is formed so as to reduce potential horizontal displacements of the bottom electrode or phase change material. At step 601, a silicon-containing insulating layer 612, such as silicon nitride, is formed above a substrate 611. A first oxide layer 614 is then formed on top of the insulating layer 612. A thin transparent carbon layer 616 is then formed on top of the first oxide layer 614. The transparent carbon layer 616 may be formed by simultaneously sputtering carbon onto the first oxide layer 614 and depositing nitrogen from an ion beam source to create a diamond-like layer. Transparent carbon is used as a sacrificial stop layer for its strength, though other materials could conceivably be used. A second oxide layer 618 is then formed on top of the transparent carbon layer 616. The first and second oxide layers 614, 618 and the transparent carbon layer 616 are referred to as a triple layer 619. Using appropriate etchants, a via 622 is etched through a portion of the triple layer 619, stopping at the insulating layer 612. At step 602, a conformal bottom electrode material 624 is deposited into the via 622. A dry etch is then used to erode away the central portions of the conformal bottom electrode material 624 to create a conductive spacer 626. At step 603, the spacer 626 is used as an etch mask to facilitate the etching of a via 628 in the insulating layer 612.

At step 604, an additional layer of conformal bottom electrode material 634 is deposited to fill the via 628. At step 605, chemical mechanical planarization ("CMP") is used to remove the upper portions of the conformal bottom electrode material 634 and the second oxide layer 618. A dashed line is used in FIG. 6A at step 604 in between layers 624 and 634 to indicate that they are both of the same conformal bottom electrode material. At step 606, a dry etchback process is used to remove the bottom electrode material 634 located above the insulating layer 612. The transparent carbon layer 616 is also removed using a dry strip removal process. The via 622 remains to facilitate the formation of the self-aligned phase change memory cell 610.

At step 607, a phase change material layer 686 is deposited in the via 622 and on top of the first oxide layer 614. Chemical mechanical planarization is used to remove excess phase change material layer 686. At step 608, the remaining first oxide layer 614 is removed using a wet strip process. A top electrode layer 688 is deposited on top of the phase change material layer 686 and the exposed insulating layer 612 as well as on the sidewalls of the phase change material layer 686. At step 609, photo patterning is used to mask the centrally-located portions of the top electrode layer 688. The non-masked peripheral portions are then etched away using a dry etch technique. The dry etch is continued until the peripheral portions of the top electrode layer 688 are removed. The remaining structure is a phase change memory cell 610 with an encapsulating top electrode 688 that is similar in construction and virtually identical in function to the memory cell 510 (FIG. 5). The method 600, however, ensures that the bottom electrode 634 is self-aligned to the center of the phase change memory cell 610. Both memory cells 510 and 610 equally approximate the ideal phase change memory cell 110 of FIG. 3.

A current distribution graph 690 is illustrated in FIG. 6B. The graph 690 illustrates a cross-sectional view of the right half (which mirrors the left half) of the phase change material 686 of the memory cell 610 and/or the right half of the phase change material 516 of the memory cell 510. Isometric contour lines 692 represent the current density of an applied reset current $I_{RST}$. The current distribution illustrated in graph 690 is improved over the current distribution of the traditional phase change memory cell 10 as illustrated in graph 90 of FIG. 1C. Completely encapsulating the phase change materials 516, 686 with the top electrode layer 538, 688 results in both a suppression of the vertical current distribution and an increase in the horizontal current distribution. The result is a more dense generally hemispherical current distribution than that produced in the traditional phase change memory cell 10. Furthermore, as in the step-shaped memory cell 410, the suppression of vertical current distribution has the additional benefit of reducing heat loss through the top electrode and the corresponding heat-induced top electrode delamination. The memory cells 510, 610 are further protected from oxidation and impurities because they are fully encapsulated by the top electrode layer 538, 688. Additionally, crosstalk between neighboring memory cells 510, 610 is reduced as the encapsulating top electrode effectively blocks the thermal conduction between neighboring memory cells.

Figure 7A:
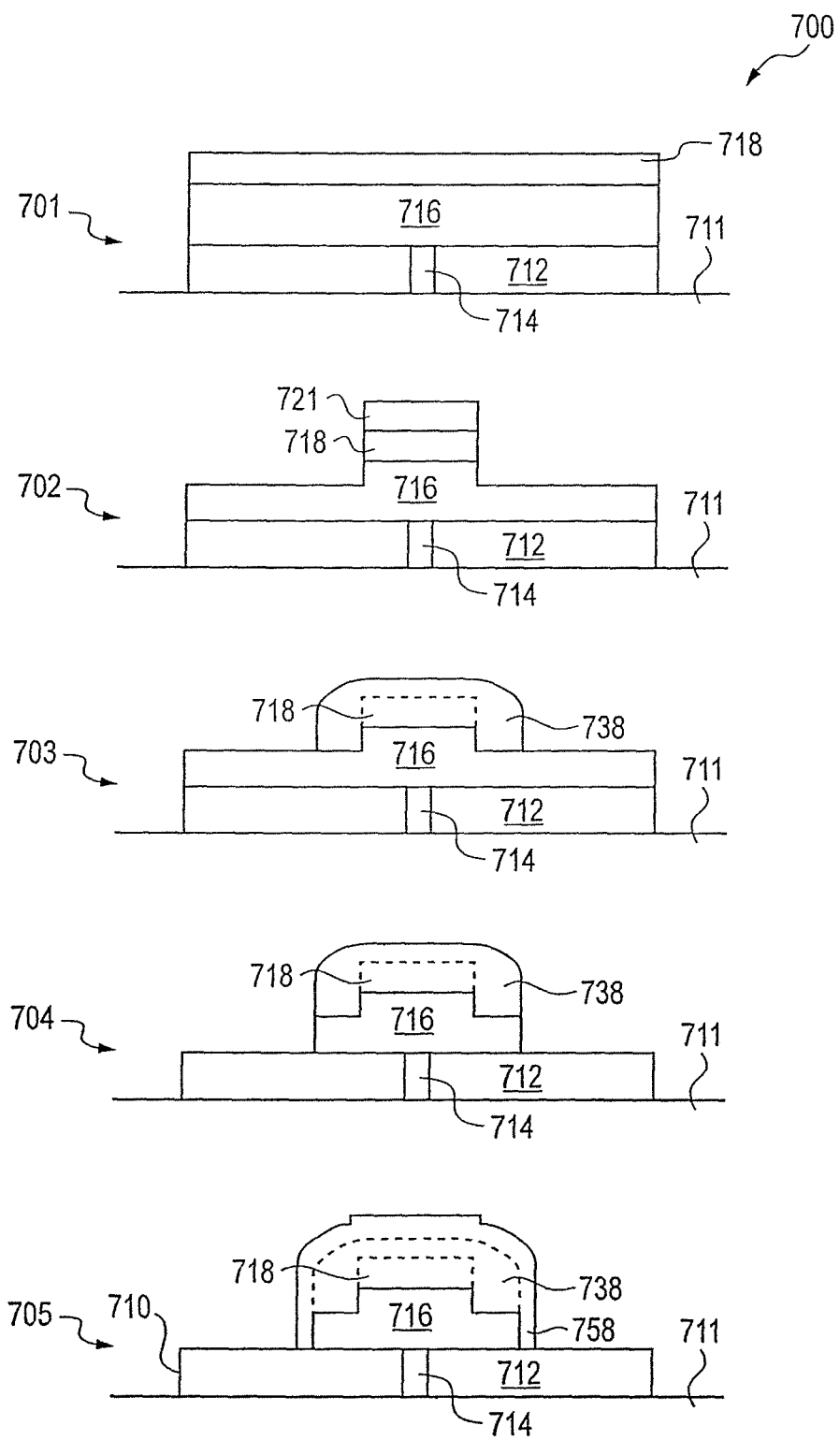
FIGS. 7A and 7B illustrate a method of fabricating a phase change memory cell and a corresponding current distribution graph according to a disclosed embodiment.

Another method 700 of fabricating a memory cell that approximates the ideal memory cell 110 is illustrated in FIG. 7A. At step 701, an insulating layer 712 is formed on top of a substrate 711 using any known method. Then, a bottom electrode 714 is formed within the insulating layer 712 by, for example, creating a via in the insulating layer 712 and filling the via with bottom electrode material 714. Excess bottom electrode material 714 may be removed using chemical mechanical planarization or other known processes. Phase change material 716 is thereafter deposited onto the bottom electrode 714 and the insulating layer 712. A top electrode layer 718 is deposited on top of the phase change material 716. At step 702, photolithography and dry etch techniques are used to pattern the top electrode 718 and etch into the phase change material 716. Step 702 is performed by applying a photoresist layer 721 to the top electrode 718. A photomask may be used to selectively remove or develop portions of the photoresist layer 721 so that the only remaining portion of the photoresist layer 721 is a portion that is located generally above the bottom electrode 714. A dry etch process is then applied to the exposed top electrode layer 718. The dry etch is continued until the exposed top electrode layer 718 and part of the phase change material 716 are etched away.

At step 703, the photoresist layer 721 is stripped away. Then, an additional top electrode layer 738 is deposited on top of the exposed phase change material 716 and the remaining first top electrode layer 718. A dashed line is used in FIG. 7A at step 703 in between layers 718 and 738 to indicate that they are both of the same top electrode material. The top electrode layer 738 is deposited so as to cover the sidewalls of the top portion of the phase change material 716. After deposition of the top electrode layer 738, spacer dry etchback is used to erode the top electrode layer 738 to form a spacer on phase change material 716. At step 704, the top electrode layer 738 is used as an etch hard mask for a dry etch process to remove the peripheral portions of the phase change material 716. At step 705, an additional top electrode layer 758 is deposited, thus completely encapsulating the remaining exposed sidewalls of the phase change material 716. The dashed lines in step 705 indicate that layers 718, 738 and 758 are each of the same top electrode material. A dry etchback process or photo patterning with dry etch is then used to remove any excess top electrode layer 758 from the insulating layer 712 so that the resulting memory cell 710 is electrically isolated from any neighboring memory cells. Memory cell 710 has structural attributes similar to both the step-shaped memory cell 410 of FIG. 4A and the completely encapsulated memory cells 510 (FIG. 5) and 610 (FIG. 6A).

Figure 7B:
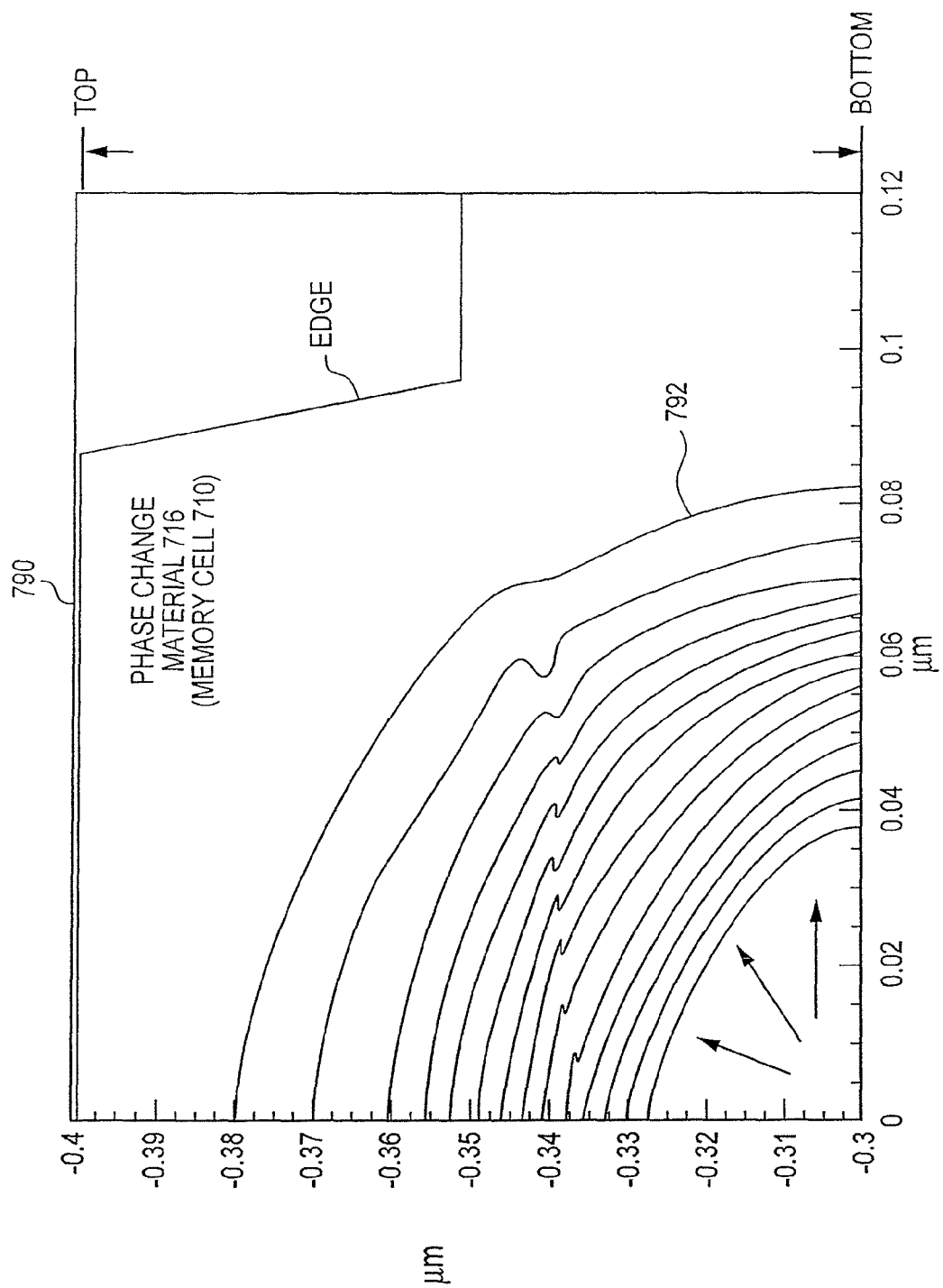

An illustration of the current distribution graph 790 for the memory cell 710 of FIG. 7A is shown in FIG. 7B. The graph 790 illustrates a cross-sectional view of the right half (which mirrors the left half) of the phase change material 716 of the memory cell 710. Isometric contour lines 792 represent the current density of an applied reset current $I_{RST}$. The current distribution illustrated in graph 790 by contour lines 792 is both vertically suppressed and horizontally expanded, as compared with the current distribution of the traditional phase change memory cell 10 illustrated in graph 90 of FIG. 1C. In other words, memory cell 710 results in current being distributed more equally in all directions rather than being concentrated in the vertical direction, as in FIG. 1C. The current distribution in graph 790 is also more vertically suppressed than the current distribution of the step-shaped memory cell 410 (FIG. 4B) and the encapsulated memory cells 510, 610 (FIG. 6B). Furthermore, the horizontal current distribution in the memory cell 710 is greater than the horizontal current distribution of the step-shaped memory cell 410 as shown in FIG. 4B. The resulting current distribution in memory cell 710 is more dense and more generally hemispherical than in memory cells 10, 410, 510 and 610. Additionally, as in the other previously described embodiments of memory cells 410, 510 and 610, the suppression of vertical current distribution results in reducing heat loss through the top electrode and also reducing the occurrence of corresponding heat-induced top electrode delamination. The memory cell 710 is further protected from oxidation and impurities because it is fully encapsulated by the top electrode layer 758. Additionally, crosstalk between neighboring memory cells 710 may be reduced.

Figure 8A:
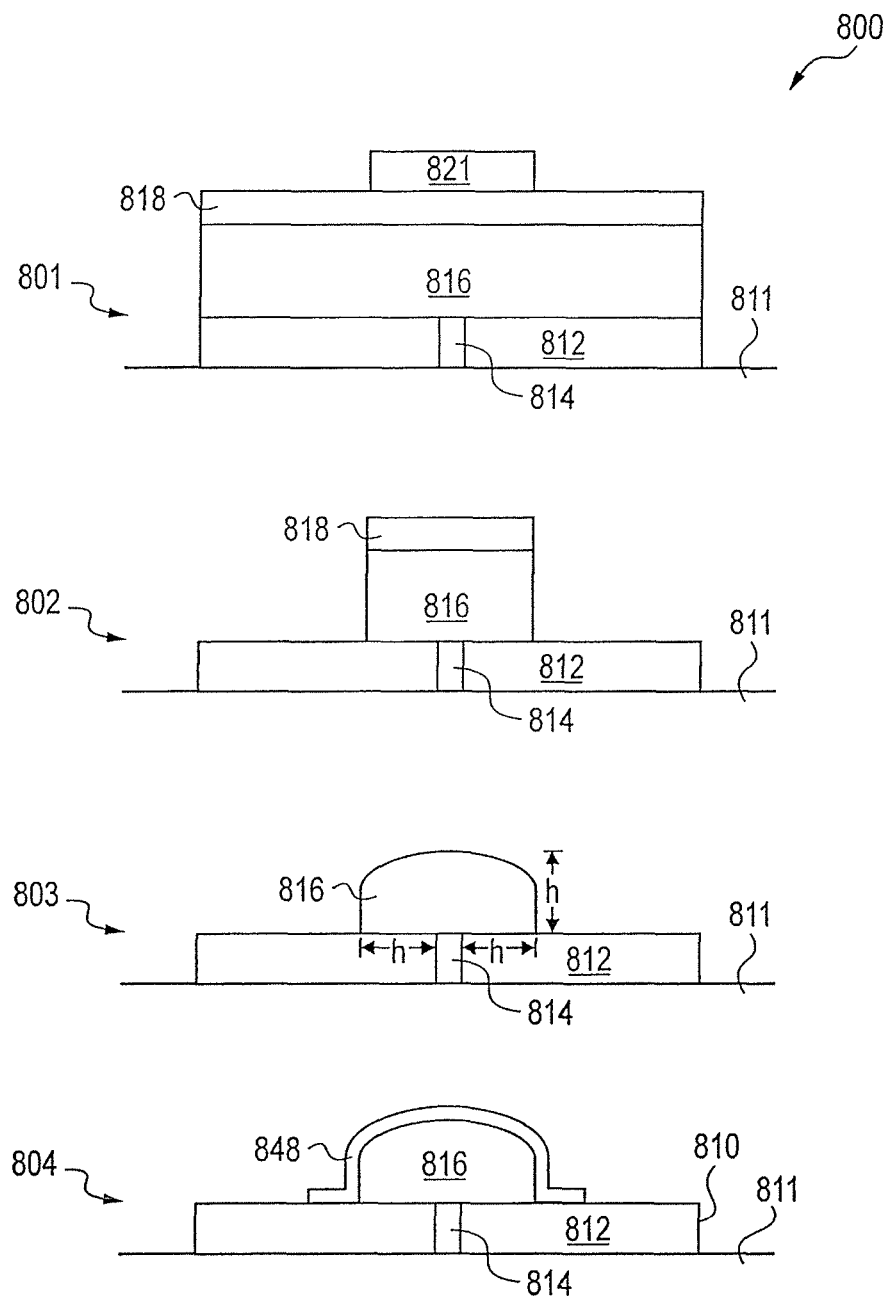
FIGS. 8A and 8B illustrate a method of fabricating a phase change memory cell and a corresponding current distribution graph according to a disclosed embodiment.

An additional embodiment of a method 800 of fabricating a memory cell that approximates the ideal memory cell 110 is illustrated in FIG. 8A. At step 801, an insulating layer 812 is formed on top of a substrate 811. A bottom electrode 814 is then formed within the insulating layer 812 by, for example, etching a via in the insulating layer 812 and then filling the via with bottom electrode material 814. Chemical mechanical planarization may be used after formation of the bottom electrode 814 in order to remove any excess bottom electrode material. Phase change material 816 is thereafter deposited onto the bottom electrode 814 and the insulating layer 812. A thin layer hard mask 818 is then deposited onto the top of the phase change material 816. A photoresist layer 821 is then applied to the thin layer hard mask 818 and patterned. A photomask may be used to selectively remove or develop portions of the photoresist layer 821 so that the only remaining portion of the photoresist layer 821 is a portion that is located generally above the bottom electrode 814. At step 802, a dry etch process is applied to the exposed thin layer hard mask 818. The dry etch is continued until the exposed thin layer hard mask 818 and the underlying phase change material 816 are etched away, leaving only those regions of the thin layer hard mask 818 and the phase change material 816 that are under the remaining photoresist layer 821. Afterwards, the remaining photoresist 821 is stripped away.

The remaining thin layer hard mask 818 is etched away at step 803. During the etch process, sputtering is used to produce a fast etch process in which the edge regions of the thin layer hard mask 818 are etched away faster than the central region of the thin layer hard mask 818. The etch continues until the entire thin layer hard mask 818 has been removed. Because the edge regions of the thin layer hard mask 818 are removed faster than the central portion, the edge regions will be completely removed sooner than the central portion. The underlying phase change material 816 is also incrementally exposed to the fast etch process, beginning with the edges of the phase change material 816 directly beneath the edge regions of the thin layer hard mask 818. Those regions of the phase change material 816 first exposed to the fast etch process will, ultimately, be more completely etched than more central regions exposed only when the thin layer hard mask 818 is completely removed. The varying exposure times result, then, in a generally hemispherical-shaped phase change material 816. The width and height of the resulting phase change material 816 are determined by a combination of the width of the thin layer hard mask 818, the thickness of the thin layer hard mask 818, and the duration and etch rate of the fast etch process. For example, it is possible to etch the phase change material 816 so that the width of its base is equal to the width of the bottom electrode 814 plus twice the height of the center of the phase change material 816, as depicted in FIG. 8A at step 803.

At step 804, a top electrode layer 848 is deposited onto the phase change material 816 and the exposed insulating layer 812. The deposition of the top electrode layer 848 also covers the sidewalls of the phase change material 816. Photolithography and dry etch are then used to remove the excess top electrode layer 848 from the insulating layer 812 so that the memory cell 810 is electrically isolated from any neighboring memory cells.

Figure 8B:
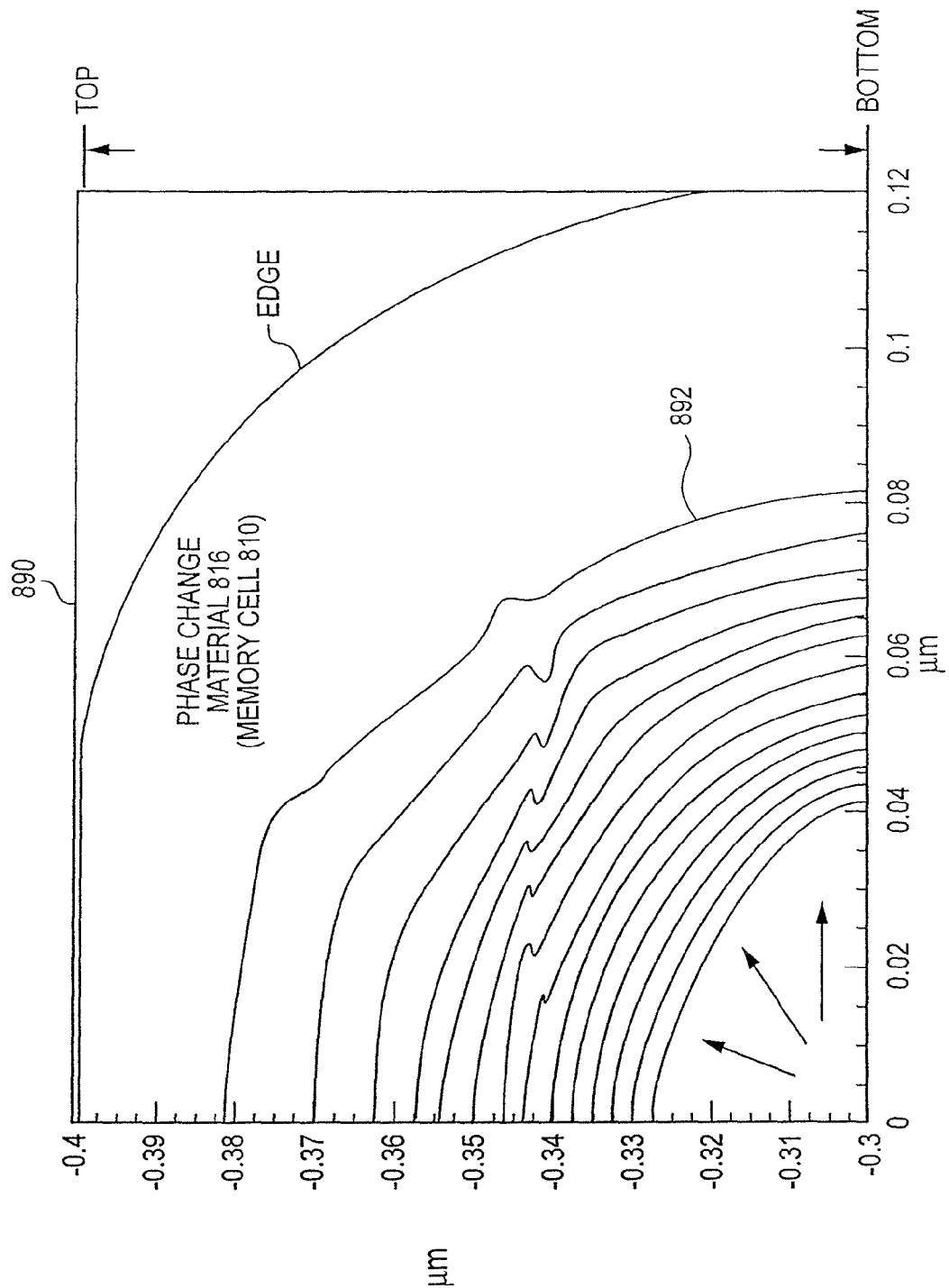

A current distribution graph 890 for the memory cell 810 of FIG. 8A is illustrated in FIG. 8B. The graph 890 illustrates a cross-sectional view of the right half (which mirrors the left half) of the phase change material 816 of the memory cell 810. Isometric contour lines 892 represent the current density of an applied reset current $I_{RST}$. The generally hemispherical-shaped memory cell 810 and the complete encapsulation by top electrode layer 848 results in both a suppression of the vertical current distribution and an increase in the horizontal current distribution. The result is a more dense generally hemispherical current distribution than that produced in the traditional phase change memory cell 10. Furthermore, the suppression of vertical current distribution has the additional benefit of reducing heat loss through the top electrode and reducing the occurrence of corresponding heat-induced top electrode delamination. The memory cell 810 is further protected from oxidation and impurities because it is fully encapsulated by the top electrode layer 848. Additionally, the memory cell 810 is also protected from oxidation and impurities by its fully encapsulating top electrode layer 848 and also has reduced crosstalk between neighboring cells.

Figure 9A:
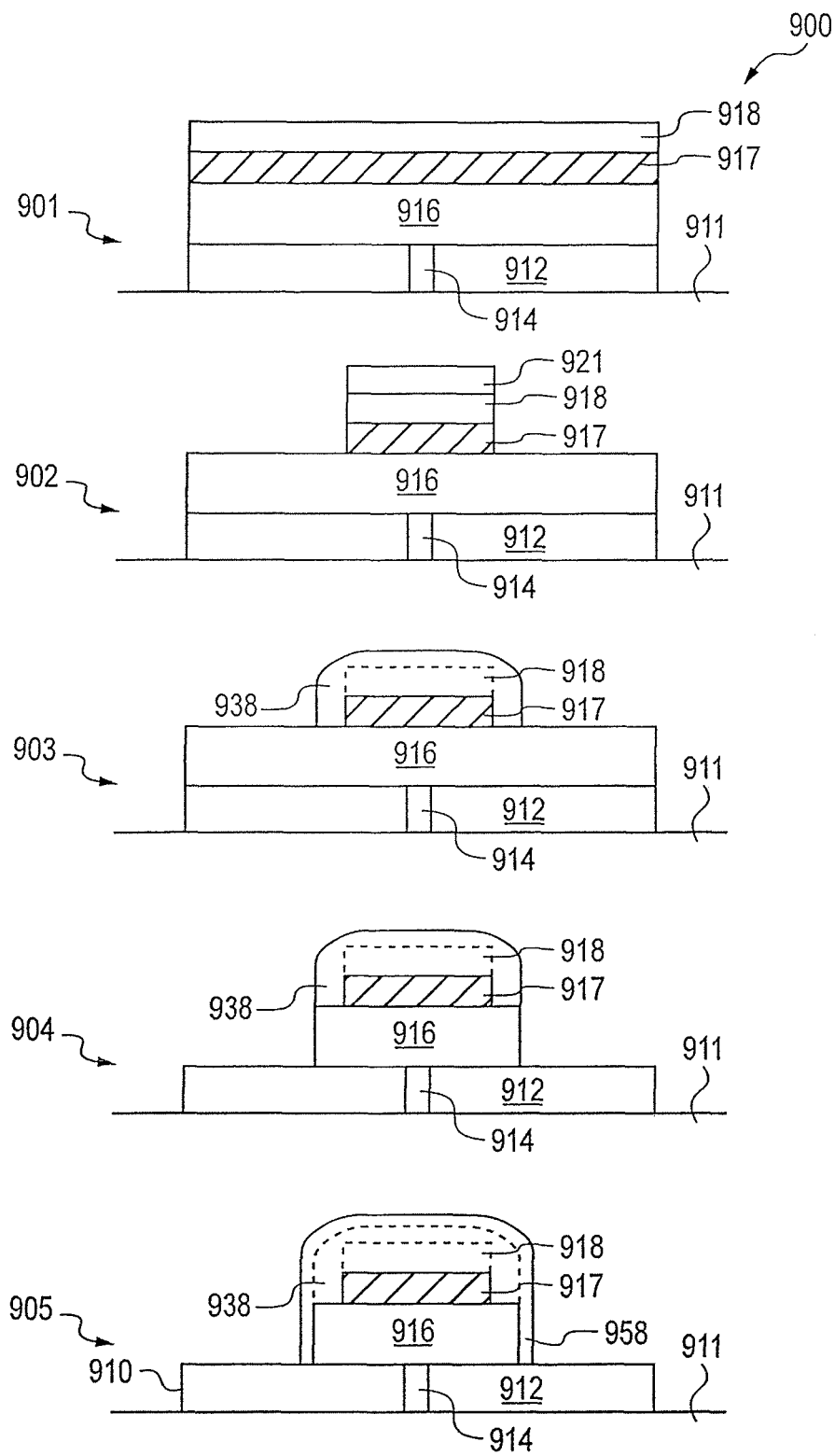
FIGS. 9A and 9B illustrate a method of fabricating a phase change memory cell and a corresponding current distribution graph according to a disclosed embodiment.

FIG. 9A illustrates another embodiment of a method 900 of fabricating a memory cell that approximates the memory cell 110. At step 901, an insulating layer 912 is formed on top of a substrate 911. A bottom electrode 914 is then formed within the insulating layer 912 using any known method (e.g., etching and filling a via, followed by chemical mechanical planarization). Phase change material 916 is thereafter deposited onto the bottom electrode 914 and the insulating layer 912. A dielectric material layer 917 is then deposited on top of the phase change material 916. Afterwards, a top electrode layer 918 is deposited over the dielectric material layer 917. At step 902, a photoresist layer 921 is applied to the top electrode layer 918. A photomask is used to selectively remove or develop portions of the photoresist layer 921 so that the only remaining portion of the photoresist layer 921 is a portion that is located generally above the bottom electrode 914. A dry etch process is applied to the exposed top electrode layer 918. The dry etch is continued until the exposed top electrode layer 918 and the underlying dielectric material layer 917 are etched away. The dry etch is stopped before any of the phase change material 916 can be etched away.

At step 903, the remaining photoresist 921 is stripped away. An additional top electrode layer 938 is deposited onto the remaining top electrode layer 918 and the exposed phase change material 916. A dashed line is used in FIG. 9A at step 903 to indicate that layers 918 and 938 are of the same top electrode material. The additional top electrode layer 938 is deposited to also cover the sidewalls of the dielectric material layer 917. A spacer dry etchback process is used to erode away the peripheral portions and the top corners of the top electrode layer 938 to form a spacer on the dielectric material layer 917.

At step 904, the top electrode material 938 is used as an etch hard mask for a dry etching of the phase change material 916. The exposed phase change material 916 is etched to the insulating layer 912. At step 905, an additional layer of top electrode material 958 is deposited on top of the remaining top electrode layer 938 and the insulating layer 912. Dashed lines are used in FIG. 9A at step 905 to indicate that layers 918, 938 and 958 are of the same top electrode material. The top electrode material 958 is deposited so as to also cover the sidewalls of the phase change material 916. Excess top electrode material 958 covering the insulating layer 912 beyond the sidewalls of the phase change material 916 is removed via a dry etchback process or via dry etch with photo patterning, thus electrically isolating the memory cell 910 from any neighboring memory cells.

Figure 9B:
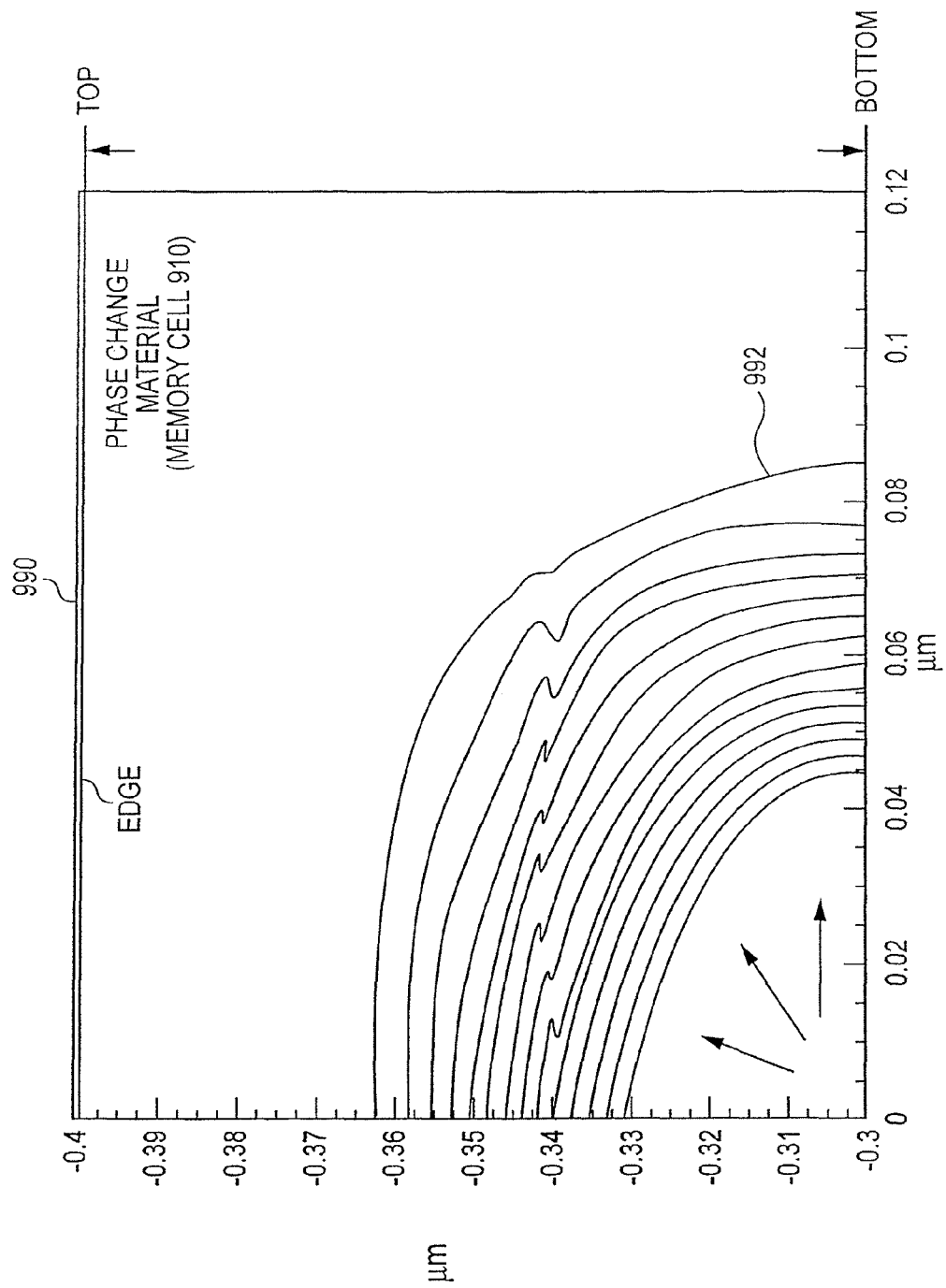

The memory cell 910 is a fully encapsulated memory cell much like memory cells 510, 610, except memory cell 910 also includes an embedded dielectric layer 917. The dielectric layer 917 helps suppress the vertical distribution of current in the memory cell 910, as shown in FIG. 9B. The graph 990 in FIG. 9B illustrates a cross-sectional view of the right half (which mirrors the left half) of the phase change material 916 of the memory cell 910. Isometric contour lines 992 represent the current density of an applied reset current $I_{RST}$. The complete encapsulation by top electrode layer 958 also results in an increase in the horizontal current distribution. As a result of the vertical current suppression, memory cell 910 is able to reduce heat loss through the top electrode 958 as well as reduce the occurrence of corresponding heat-induced top electrode delamination. Like the other fully encapsulated memory cells discussed above, the memory cell 910 is also protected from oxidation and impurities by its fully encapsulating top electrode layer 958 and also has reduced crosstalk between neighboring cells.

Figure 10A:
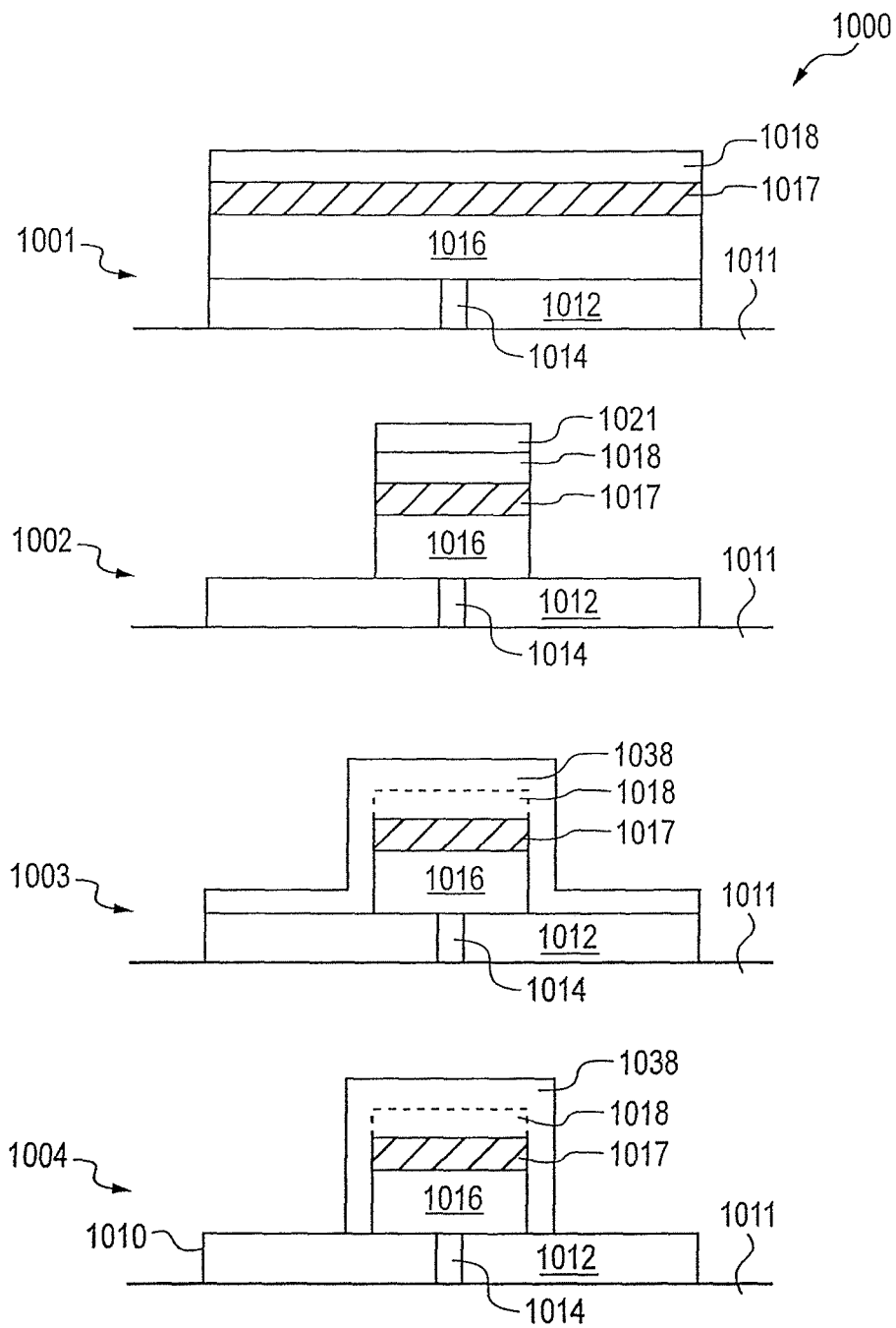
FIGS. 10A and 10B illustrate a method of fabricating a phase change memory cell and a corresponding current distribution graph according to a disclosed embodiment.

FIG. 10A illustrates another embodiment of a method 1000 of fabricating a memory cell 1010 that reshapes the current distribution to increase horizontal current distribution. At step 1001, an insulating layer 1012 is formed on top of a substrate 1011. Then, a bottom electrode 1014 is formed within the insulating layer 1012 using any known method (e.g., etching and filling a via with bottom electrode material followed by chemical mechanical planarization). Phase change material 1016 is thereafter deposited onto the bottom electrode 1014 and the insulating layer 1012. A dielectric material layer 1017 is then deposited on top of the phase change material 1016. Afterwards, a top electrode layer 1018 is deposited over the dielectric material layer 1017. At step 1002, a photoresist layer 1021 is applied to the top electrode layer 1018. A photomask is used to selectively remove or develop portions of the photoresist layer 1021 so that the only remaining portion of the photoresist layer 1021 is a portion that is located generally above the bottom electrode 1014. A dry etch process is applied to the exposed top electrode layer 1018. The dry etch is continued until the exposed top electrode layer 1018, the underlying dielectric material layer 1017 and the underlying phase change material 1016 are etched away. The dry etch is stopped at the insulating layer 1012.

At step 1003, the remaining photoresist 1021 is stripped away. An additional top electrode layer 1038 is deposited onto the remaining top electrode layer 1018 and the exposed insulating layer 1012. Dashed lines are used in FIG. 10A at step 1003 to indicate that layers 1018 and 1038 are of the same top electrode material. The additional top electrode layer 1038 is deposited to also cover the sidewalls of the phase change material 1016 and the dielectric material layer 1017. At step 1004, a dry etchback process or a dry etch with photo patterning is used to remove the peripheral portions of the top electrode layer 1038, thus electrically isolating the memory cell 1010 from any neighboring memory cells.

Figure 10B:
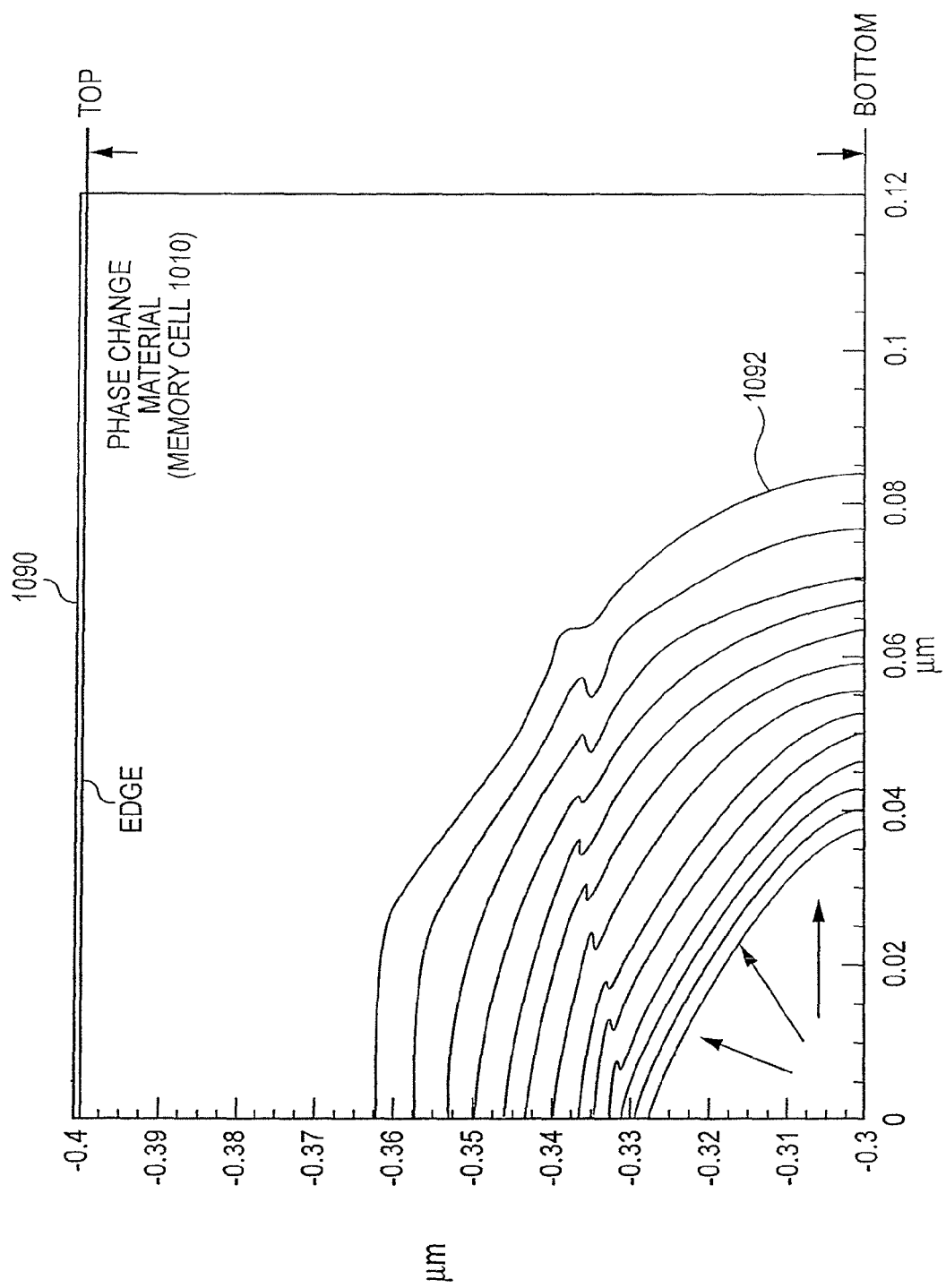

The memory cell 1010 is a fully encapsulated memory cell with dielectric layer 1017 much like memory cell 910 (FIG. 9B). The dielectric layer 1017 helps suppress the vertical distribution of current in the memory cell 1010, as shown in FIG. 10B. As a result, memory cell 1010 is able to reduce heat loss through the top electrode 1038 as well as reduce the occurrence of corresponding heat-induced top electrode delamination. Like the other fully encapsulated memory cells discussed above, the memory cell 1010 is also protected from oxidation and impurities by its fully encapsulating top electrode layer 1038. Crosstalk between neighboring memory cells is also reduced.

Figure 11:
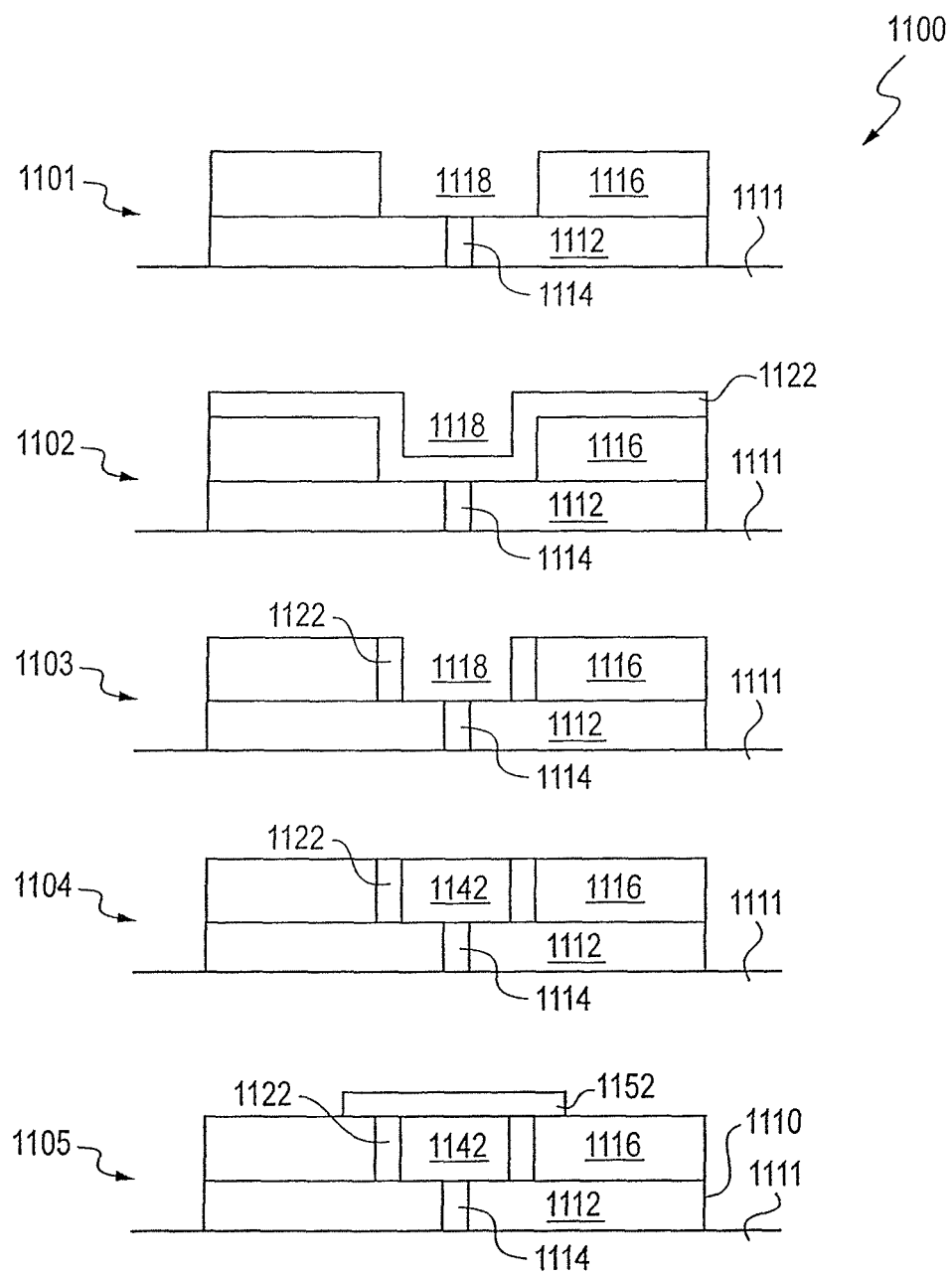
FIG. 11 illustrates a method of fabricating a phase change memory cell according to a disclosed embodiment.

FIG. 11 illustrates another embodiment of a method 1100 of fabricating a memory cell 1110 that approximates the ideal memory cell 110. At step 1101, an insulating layer 1112 is formed on top of a substrate 1111 using any known method. Then, a bottom electrode 1114 is formed within the insulating layer 1112. The bottom electrode 1114 may be formed, for example, by etching a via through the insulating layer 1112 and then filling the via with bottom electrode material. Chemical mechanical planarization may be used to remove excess bottom electrode material. A dielectric layer 1116 is then deposited on top of the bottom electrode 1114 and the insulating layer 1112. Photo and dry etch patterning is then used to form a via 1118 over the bottom electrode 1114 and adjacent areas of the insulating layer 1112. At step 1102, a layer of conformal bottom electrode material 1122 is deposited on top of the dielectric layer 1116 and the exposed bottom electrode 1114 and insulating layer 1112, as well as on the sidewalls of the via 1118. At step 1103, a dry etchback process is used to etch away the conformal bottom electrode material 1122 from the top surfaces of the dielectric layer 1116, the insulating layer 1112 and the bottom electrode 1114, resulting in only the sidewalls of the via 1118 being coated by the conformal bottom electrode material 1122.

At step 1104, phase change material 1142 is deposited over the exposed dielectric layer 1116 and conformal bottom electrode material 1122, also filling the via 1118. Chemical mechanical planarization is used to remove the upper layer of the deposited phase change material 1142 so that the phase change material 1142 only remains within the via 1118. At step 1005, a top electrode layer 1152 is deposited on top of the exposed dielectric layer 1116, the conformal bottom electrode material 1122 and the phase change material 1142. Photo and dry etch patterning is used to remove the portions of the top electrode layer 1152 that are not proximate to the conformal bottom electrode material 1132 and the phase change material 1142.

Memory cell 1110 is a fully encapsulated memory cell bounded by the dielectric layer 1116. As such, memory cell 1110 has each of the benefits of the other fully encapsulated memory cells described above. In addition, the bounding dielectric layer 1116 helps to insulate the memory cell 1110 from neighboring memory cells. Additionally, method 1100 minimizes the amount of dry etch damage that may occur to the memory cell 1110.

Figure 12:
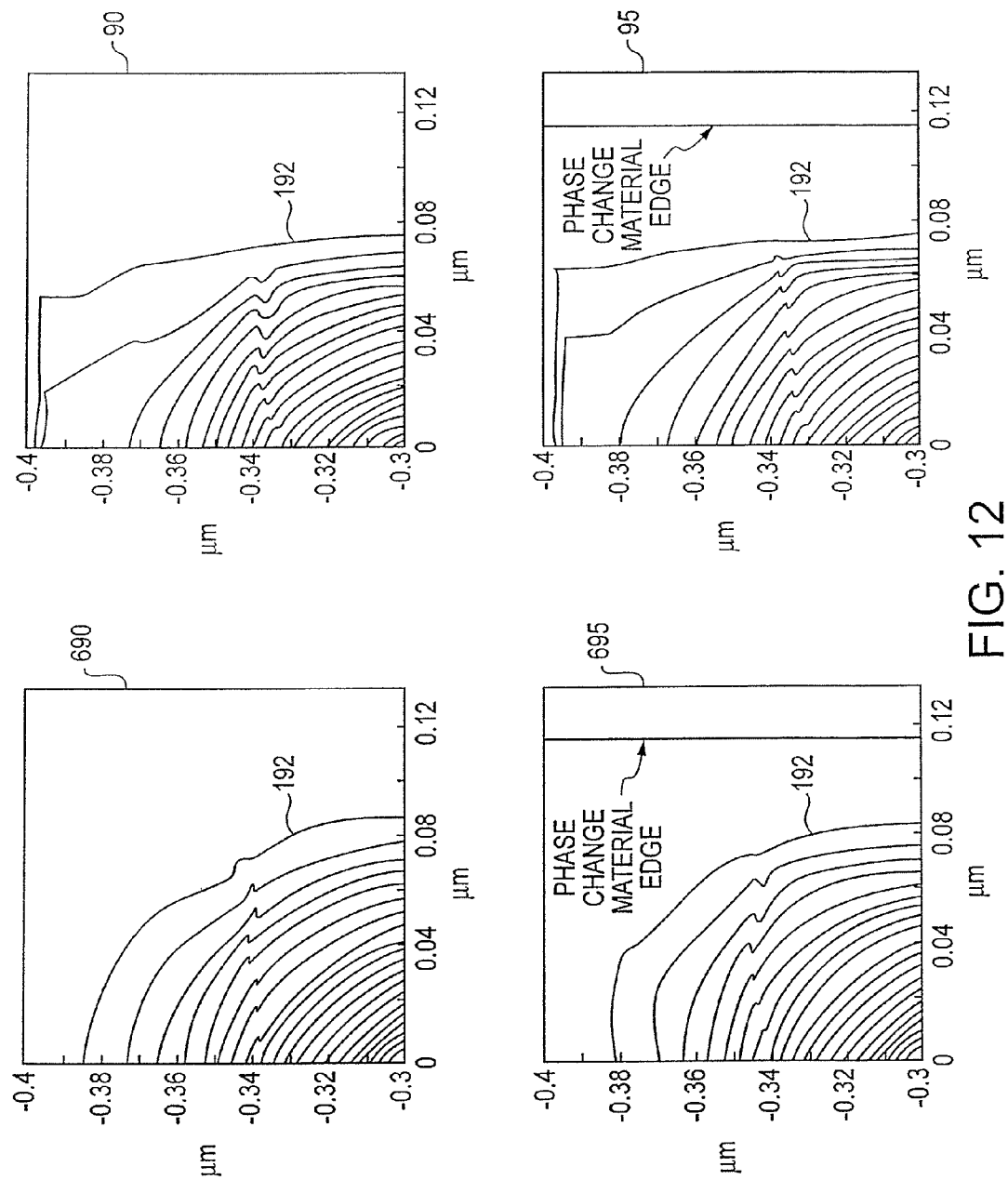
FIG. 12 shows current distribution graphs for phase change memory cells according to a disclosed embodiment.

In addition to the already described benefits of the improved phase change memory cells 410-1110, the improved phase change memory cells 410-1110 are also more robust than the traditional phase change memory cell 10 in response to critical dimension variations and misalignments. FIG. 12 illustrates the effect of a misalignment or a variation in cell dimensions. Current distribution graphs 90 and 690 are illustrated to represent the current distributions in a traditional phase change memory cell 10 and in an encapsulated phase change memory cell 510, 610 with normal dimensions. Isometric contour lines 192 represent the current density of an applied reset current $I_{RST}$. Current distribution graphs 95 and 695 show the effect of an 8% variation in the width of the phase change memory cells 10, 510, 610, respectively. Graph 95 shows a significant spread in the vertical current distribution as a result of the misalignment or dimensional variation. In contrast, graph 695 shows practically no effect from the misalignment or dimensional variation. As exemplified by the misaligned phase change memory cell 510, 610 in FIG. 12, the improved phase change memory cells 410-1110 each exhibit greater tolerance to critical dimension variations and photo misalignment. Similarly, each of the improved phase change memory cells 410-1110 demonstrate better scalability than a traditional phase change memory cell 10.

Figure 13:
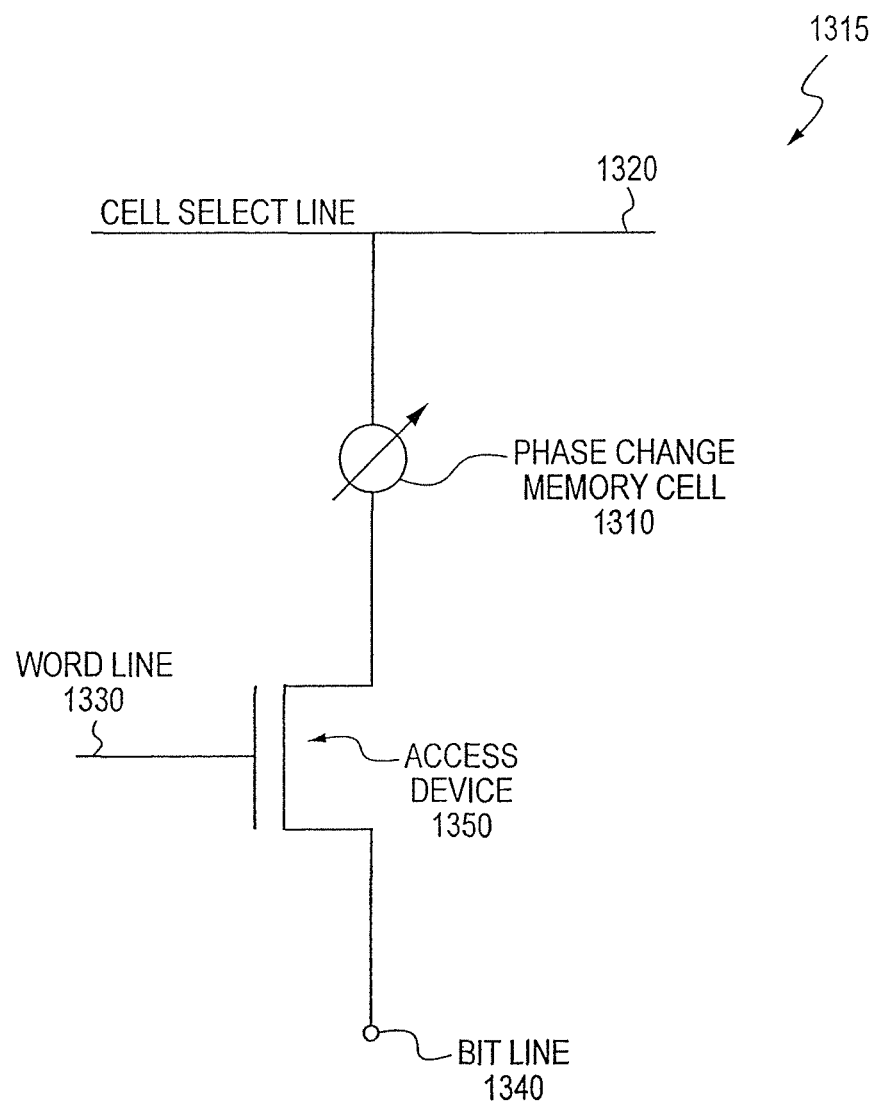
FIG. 13 illustrates a phase change memory bit structure according to a disclosed embodiment.

Each of the improved phase change memory cells 410-1110 may be arranged into a memory bit structure 1315, illustrated in FIG. 13. In FIG. 13, memory cell 1310 can represent any of the improved phase change memory cells 410-1110 described above. The memory cell 1310 is connected to a cell select line 1320 via either the cell's top or bottom electrode. The opposing electrode is connected to an access device 1350 such as an access transistor. The access device 1350 is gated by a word line 1330. A bit line 1340 provides a source to the access device 1350 and is connected to the memory cell 1310 when the access device 1350 is activated by the word line 1330.

Figure 14:
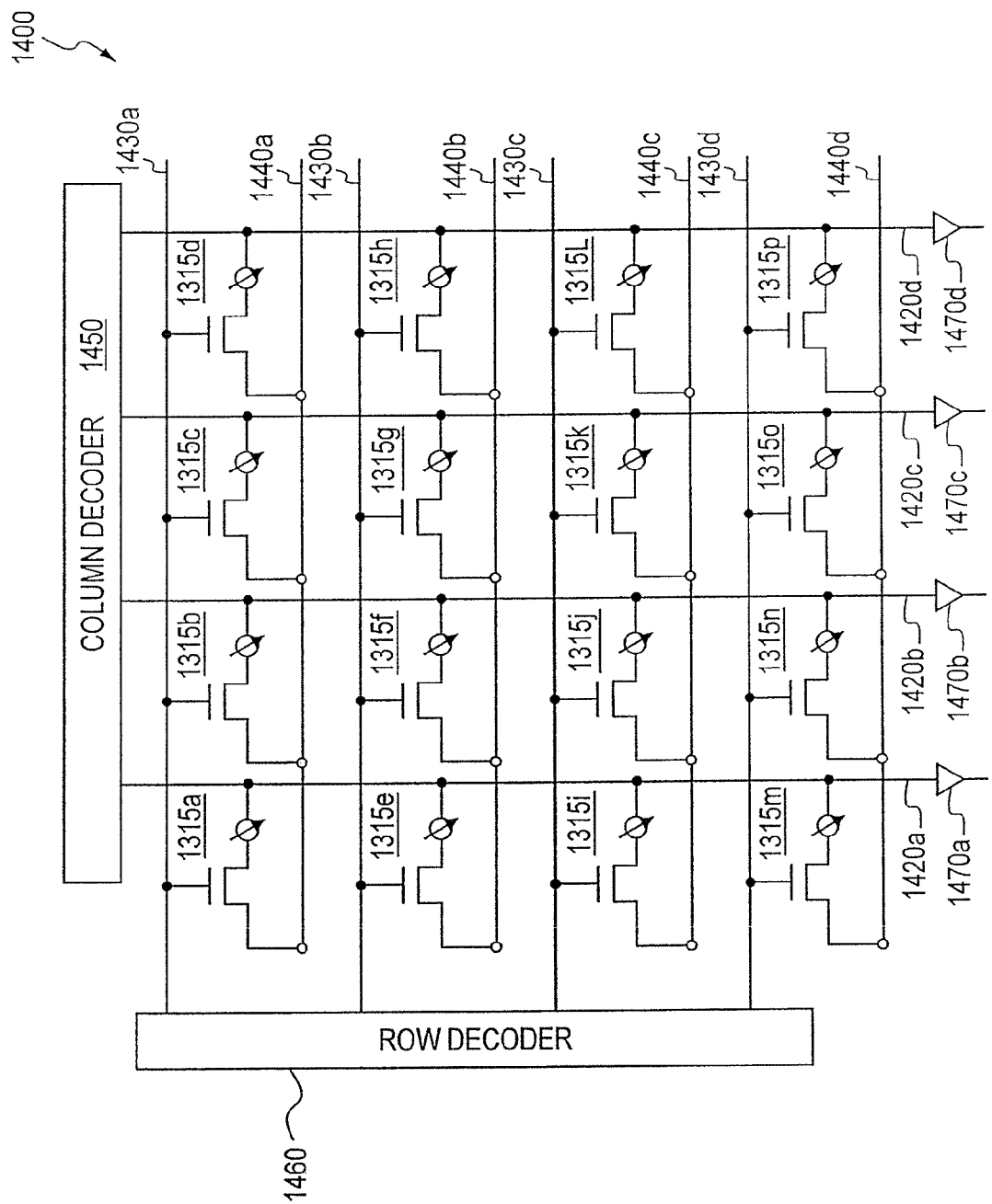
FIG. 14 illustrates an array of phase change memory bit structures according to a disclosed embodiment.

The memory bit structures 1315 of FIG. 13 may be arranged in an array of memory bit structures, as illustrated in FIG. 14. In FIG. 14, a memory device 1400 includes an array of memory bit structures 1315a-1315p. The memory bit structures 1315a-1315p are arranged in rows and columns. The rows and columns may be partially staggered or may be aligned as a simple parallel grid as in FIG. 14. The memory bit structures 1315a-1315p along any given cell select line 1420a-1420d do not share a common word line 1430a-1430d. Additionally, the memory bit structures 1315a-1315p along any given cell select line 1420a-1420d do not share a common bit line 1440a-1440d. In this manner, each memory bit structure is uniquely identified by the combined selection of the word line to which the gate of the memory cell access device is connected, and the cell select line to which the memory cell is connected.

Each word line 1430a-1430d is connected to a word line driver in the form of a row decoder 1460 for selecting the respective word line for an access operation. Similarly, each cell select line 1420a-1420d is coupled to a driver in the form of a column decoder 1450. The current passing through a selected memory bit structure 1315a-1315p is measured by sense amplifiers 1470a, 1470d connected respectively to the cell select lines 1420a-1420d.

For simplicity, FIG. 14 illustrates a memory array having only four rows of memory bit structures 1315 on four cell select lines 1420a-1420d and four columns of memory bit structures 1315 on four word lines 1430a-1430d. However, it should be understood that in practical applications, the memory device 1400 has significantly more memory bit structures in an array. For example, an actual memory device may include several million memory bit structures 1315 arranged in a number of subarrays.

Figure 15:
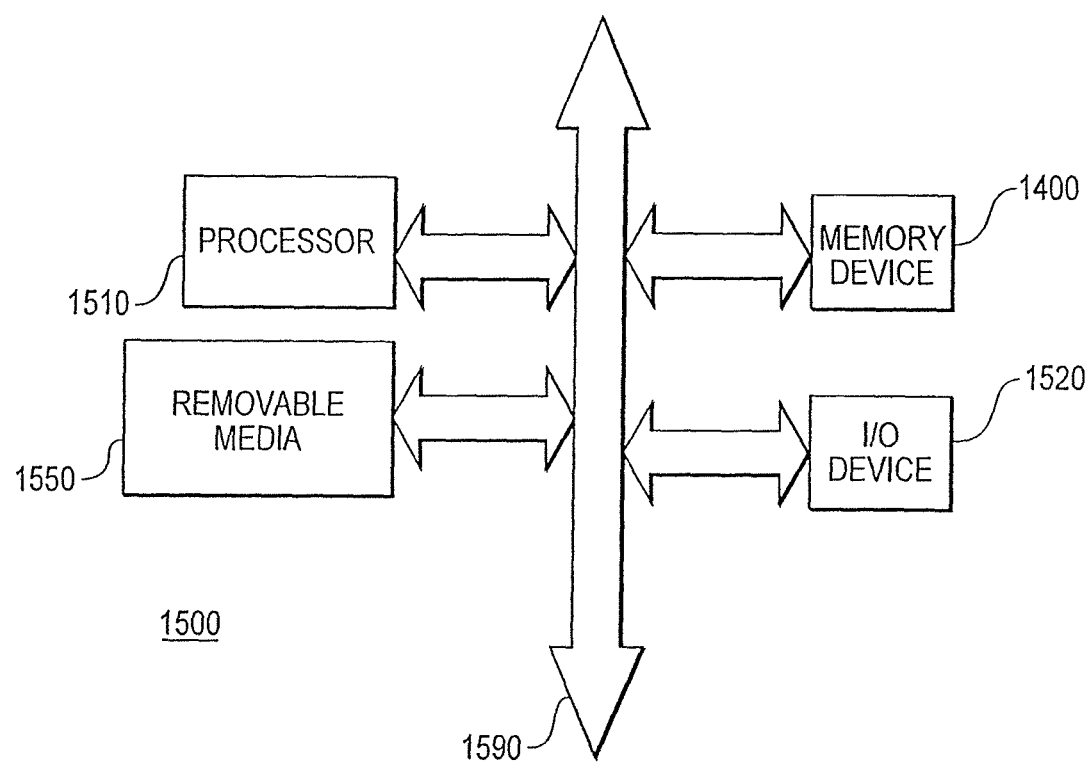
FIG. 15 illustrates a processor system that includes a memory device according to a disclosed embodiment.

It should be appreciated that the improved phase change memory cells 410-1110 may be fabricated as part of an integrated circuit. The corresponding integrated circuits may be utilized in a typical processor system. For example, FIG. 15 illustrates a typical processor system 1500 which includes a memory device 1400 employing improved phase change memory cells such as memory cells 410-1110 in accordance with the above described embodiments. A processor system, such as a computer system, generally comprises a central processing unit (CPU) 1510, such as a microprocessor, a digital signal processor, or other programmable digital logic devices, which communicates with an input/output (I/O) device 1520 over a bus 1590. The memory device 1400 communicates with the CPU 1510 over bus 1590 typically through a memory controller.

In the case of a computer system, the processor system may include peripheral devices such as removable media devices 1550 which communicate with CPU 1510 over the bus 1590. Memory device 1400 is preferably constructed as an integrated circuit, which includes one or more phase change memory devices. If desired, the memory device 1400 may be combined with the processor, for example CPU 1510, as a single integrated circuit.

It should also be appreciated that various embodiments have been described as using a phase change material as an exemplary resistance variable material. The invention may also be used in other types of resistive memory to improve current flow through whatever resistance variable material is used.

The above description and drawings should only be considered illustrative of exemplary embodiments that achieve the features and advantages described herein. Modification and substitutions to specific process conditions and structures can be made. Accordingly, the invention is not to be considered as being limited by the foregoing description and drawings, but is only limited by the scope of the appended claims.

What is claimed as new and desired to be protected by Letters Patent of the United States:

1. A method of fabricating a variable resistance memory cell, comprising:
   forming a first electrode;
   forming a variable resistance region from variable resistance material deposited over a top surface of the first electrode such that a first side of the variable resistance region abuts the first electrode at a first plane and such that a second side of the variable resistance region opposes the first side; and forming a second electrode over the second side of the variable resistance region, the second electrode including projections that extend towards the first plane.

2. The method of claim 1, wherein forming the second electrode includes forming the projections of the second electrode so as to encapsulate a portion of the variable resistance region.

3. The method of claim 1, wherein forming the variable resistance region includes forming sidewalls that are completely encapsulated by the projections of the second electrode.

4. The method of claim 1, wherein forming the variable resistance region includes forming the variable resistance region to be thicker in a center of the variable resistance region than near the edges of the variable resistance region.

5. The method of claim 1, wherein forming the first electrode includes forming the first electrode such that only a portion of the first side of the variable resistance region is abutted by the first electrode.

6. The method of claim 5, wherein forming the variable resistance region includes forming the variable resistance region to be thicker at the portion of the first side abutted by the first electrode than at other portions of the variable resistance region.

7. The method of claim 5, further comprising forming an insulating layer that abuts portions of the first side of the variable resistance region.

8. The method of claim 5, wherein forming the variable resistance region includes forming the second side of the variable resistance region to be stepped.

9. The method of claim 8, wherein forming the second electrode includes forming the second electrode to be stepped in the same manner that the second side of the variable resistance region is stepped.

10. The method of claim 5, wherein forming the variable resistance region includes forming the second side of the variable resistance region to be generally hemispherical.

11. The method of claim 10, wherein forming the second electrode includes forming the second electrode to be generally hemispherical.

12. The method of claim 1, wherein forming the variable resistance region comprises forming a phase change material.

* * * * *